United States Patent [19]

Frei

[11] Patent Number: 5,159,201
[45] Date of Patent: Oct. 27, 1992

[54] SHAPE DECOMPOSITON SYSTEM AND METHOD

[75] Inventor: Joseph B. Frei, Hopewell Junction, N.Y.

[73] Assignee: International Business Machines Corporation, Armonk, N.Y.

[21] Appl. No.: 736,663

[22] Filed: Jul. 26, 1991

[51] Int. Cl.$^5$ ............................................. H01J 37/302
[52] U.S. Cl. .................................. 250/492.2; 364/490; 364/491
[58] Field of Search .................... 250/492.2, 492.22; 364/485, 490, 491

[56] References Cited

U.S. PATENT DOCUMENTS

| | | | |
|---|---|---|---|
| 3,956,635 | 3/1976 | Chang | 250/492 A |
| 4,147,937 | 4/1979 | Buelow et al. | 250/492 A |
| 4,259,724 | 3/1981 | Sugiyama | 364/491 |
| 4,291,231 | 9/1981 | Kawashima et al. | 250/492 A |
| 4,511,980 | 4/1985 | Watanabe | 364/491 |
| 4,532,598 | 5/1985 | Shibayama | 364/491 |
| 4,554,625 | 11/1985 | Otten | 364/148 |
| 4,586,141 | 4/1986 | Yasuda et al. | 364/490 |
| 4,717,644 | 1/1988 | Jones et al. | 430/296 |
| 4,718,019 | 1/1988 | Fillion et al. | 364/491 |
| 4,728,797 | 3/1988 | Gotou et al. | 250/492.3 |
| 4,748,132 | 5/1988 | Fukuzawa et al. | 437/25 |
| 4,789,945 | 12/1988 | Niijima | 364/490 |
| 4,820,928 | 4/1989 | Ooyama et al. | 250/492.2 |
| 4,837,447 | 6/1989 | Pierce et al. | 250/492.22 |
| 4,878,177 | 10/1989 | Ikenaga et al. | 250/492.22 |
| 4,914,304 | 4/1990 | Koyama | 250/492.2 |
| 4,992,668 | 2/1991 | Swetman | 250/492.2 |
| 5,008,830 | 4/1991 | Moriizumi et al. | 250/492.22 |
| 5,062,054 | 10/1991 | Kawakami et al. | 364/489 |

OTHER PUBLICATIONS

J. Vac. Science and Technology, vol. 7, No. 6, Nov.–Dec. 1989, pp. 1556–1560, "Proximity Effect Correction in Electron Beam Lithography".
J. Vac. Science and Technology, vol. 7, No. 6, Nov.–Dec. 1989, pp. 1524–1527, "Proximity Effect Correction for an Electron Beam Direct Writing System EX-7".
J. Vac. Science and Technology, vol. 6, No. 6, Nov.–Dec. 1988, pp. 2061–2065, "Integrated Data Conversion for the Electron Beam Exposure System".
J. Vac. Science and Technology, vol. 19, No. 4, Nov.–Dec. 1981, pp. 988–992, "Advanced Pattern Data Processing Technique for Raster Scan Electron Beam Exposure System".
IBM J. Res. & Dev., vol. 24, No. 5, Sep. 1980, pp. 537–544, "Proximity Correction Enhancements for 1-um Dense Circuits".
J. Vac. Science and Technology, vol. 16, No. 6, Nov.–Dec. 1979, pp. 1803–1808, "Data Compaction and Vector Scan E-Beam System Performance Using Novel Algorithm for Recognition of Pattern Steps and Repeats".
IBM TDB, vol. 21, No. 4, Sep. 1978, pp. 1680–1682, "Bit Image Pattern Filling Algorithm".
IBM TDB, vol. 27, No. 7A, Dec. 1984, pp. 3726–3727, "General-Purpose Pattern Generator for E-Beam Lithography".
IBM TDB, vol. 24, No. 11A, Apr. 1982, pp. 5681–5687, "Method and Apparatus to Provide Rapid Interpretation of Digital Source Information During Electron Beam Pattern Writing of Rectangular Shapes".

Primary Examiner—Bruce C. Anderson
Attorney, Agent, or Firm—Charles W. Peterson, Jr.

[57] ABSTRACT

A system and method of forming shapes on a semiconductor chip by exposing a radiation sensitive layer by an electron beam lithographic tool. Design shapes are converted into rectangles in a single pass through the shapes by a computer postprocessor. The postprocessor processes the design shapes by converting them to edges and sorting the edges from top to bottom and left to right. Chains of top and side edges are built from the sorted edges until a bottom edge is encountered which triggers a fill. When a fill is triggered, subsequent bottom edges are examined to avoid unnecessary sliver generation during the fill or at future fills. Rectangles are generated to fill as much of the area under the chain as possible while minimizing the number of slivers created or which may be created at future fills. Unfilled portions of the chain are left for later fills and edge processing continues until all edges have been processed and the entire design is filled with rectangles. An optimum fill is produced and slivers are minimized.

25 Claims, 10 Drawing Sheets

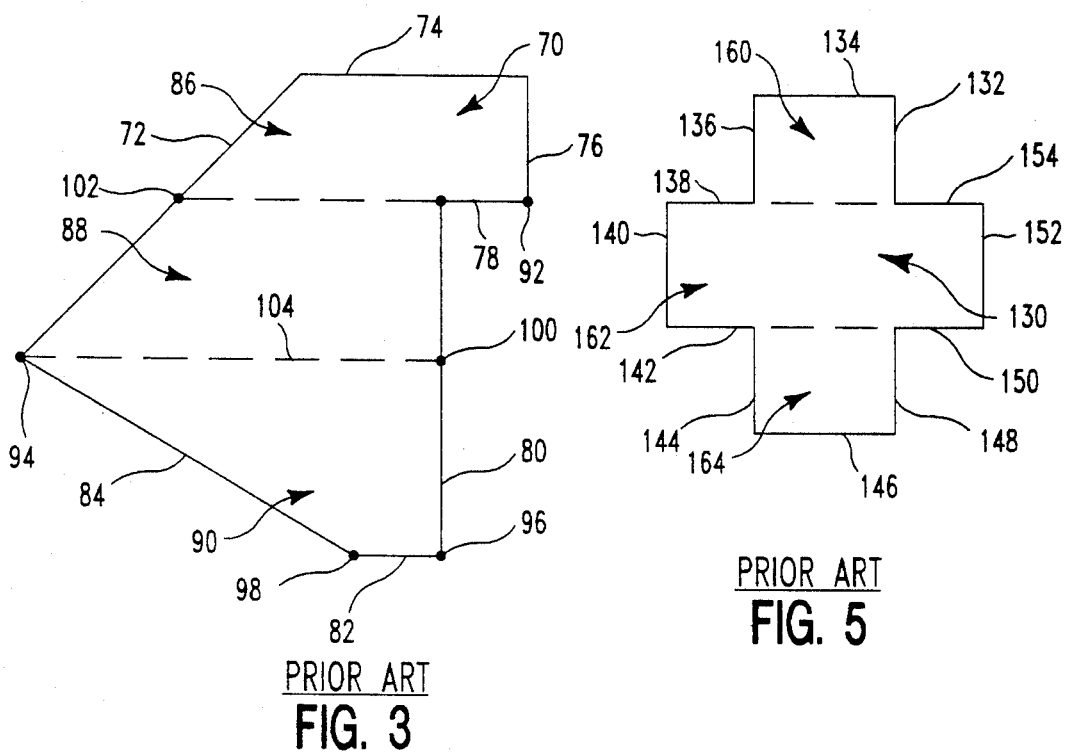
PRIOR ART
FIG. 3
PRIOR ART
FIG. 5
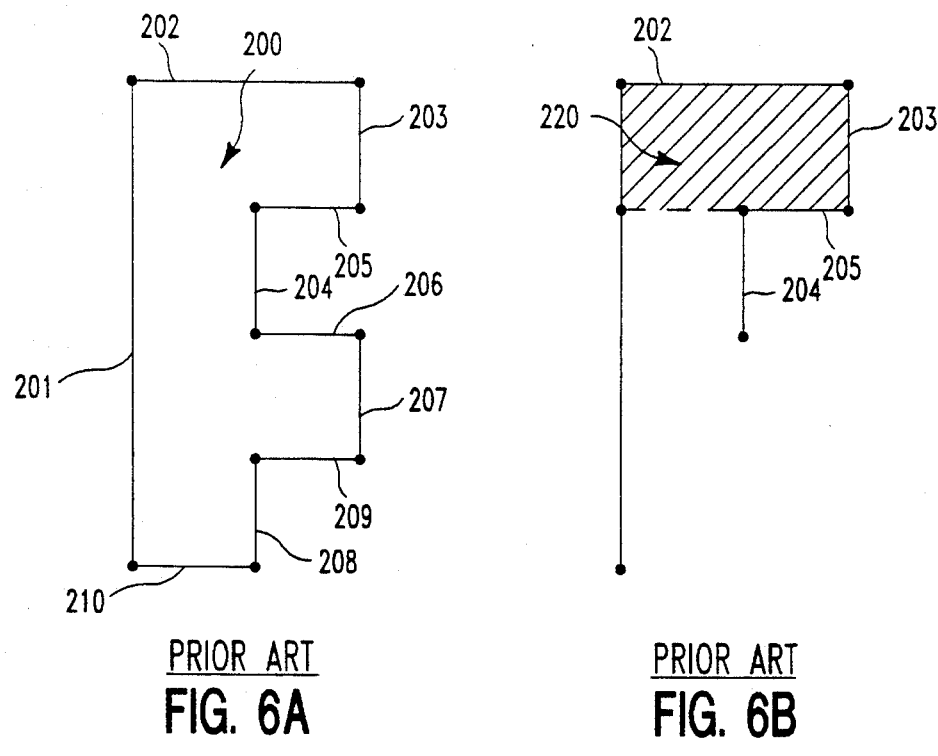
PRIOR ART
FIG. 6A
PRIOR ART
FIG. 6B

SHAPE DECOMPOSITON SYSTEM AND METHOD

RELATED APPLICATION

Application Ser. No. 736654 to Chung et al., "E-Beam Control Data Compaction System And Method" which was filed coincident with this application is related to this application and assigned to the assignee of this invention.

FIELD OF THE INVENTION

The present invention relates generally to the fabrication of integrated circuits and more particularly, to a system and method of lithographic patterning of radiation sensitive layers by an electron beam exposure system

BACKGROUND OF THE INVENTION

Integrated circuit shapes can be patterned on a wafer entirely by means of direct writing electron beam (e-beam) lithography. Using e-beam to write microcircuit patterns in integrated circuit fabrication is well known in the art. The intended pattern can be directly written onto the wafer by exposing a thin layer of radiation sensitive material on the wafer with a beam of electrons or, alternatively, by using a mask made with an e-beam tool to optically expose a thin layer of photoresist on the semiconductor wafer. Whether the pattern is directly written or indirectly written with a mask, the e-beam tool control remains the same. See generally, U.S. Pat. 4,789,945 for an example of direct writing e-beam lithography used to expose to an entire wafer. The use of a computer to control the e-beam is also well known. See U.S. Pat. No. 4,728 797 for an example of a computer controlled microcircuit. fabrication system.

While e-beam lithography provides the advantage of very sharply defined patterns for very small geometric shapes, transferring those shapes from a computer designed shape to a physical image on a photoresistive, or radiation sensitive layer (resist), can be both expensive and time consuming. Most of the cost associated with transferring the shape is computer operating cost, which is also generally time dependent. Therefore, reducing computer operating time will reduce both the time and the expense associated with e-beam lithography. Several approaches have been used to reduce the time required to expose a wafer with an e-beam tool. See U.S. Pat. No. 4,147,937 for an example of a method and an apparatus for exposing a wafer by raster scan writing, i.e., a single line at a time. See also, U.S. Pat. No. 4,914,304 for an example of an e-beam exposure system that uses a shaped beam to improve exposure of different shapes. Although these prior art approaches reduce the exposure time, they do not appreciably reduce the computer time required to convert the design shape into Numerical Control for the e-beam tool (process a design shape). Using the prior art method of processing design shapes, it sometimes takes several hundreds of Central Processing Unit (CPU) minutes to convert an entire design into a format which may be used to control an e-beam tool. So, converting the graphics representation of a shape to control parameters for controlling the e-beam tool is a major computer bottleneck.

THe flow diagram of FIG. 1 shows the steps typically taken in the prior art to convert design data into e-beam tool control data and expose a semiconductor wafer. Each design shape is represented (30) in a graphics language by lines, rectangles, circles, and polygons. Such a representation is characteristic of the particular graphics language used and the shape represented. The graphics representation of the shape must be converted to control signals for an e-beam tool. The e-beam tool uses the converted, or postprocessed, information to direct the electron beam onto the radiatio.n sensitive layer, which writes, or exposes, the design shape onto the layer. A postprocessor is a computer program which combines the graphics data (30) and key e-beam tool processing parameters (32), also called keywords, to produce Numerical Control (NC) data for use by the e-beam lithographic exposure tool. Converting the design data to numerical control data iis called postporcessing the design data. Numerical control data is the data used to control exposure of the radiation sensitive layer by the e-beam tool.

Before postprocessing the design data, the graphics language representation of the design data (30) and the keywords (32) are checked (34) for syntax errors. After verifying that there are no syntax errors, the postprocessor decomposes (36) each design shape into a series of edges and then labels (38) each edge. An edge is a portion of the shape's perimeter and is normally a straight line connecting two vertices on the shape. Each converted edge is labeled (38) according to its position on a shape as a top, bottom, right or left edge. The postprocessor then applies (40) keywords which describe shape compensation, known as etch biases, to the edges. An etch bias is a compensation for the amount of distortion to a design shape which occurs in the process of making the final shape. The postprocessor then transforms (42) the edges from the graphics language grid (a unit of measure) to the e-beam tool grid. Alternatively, the postprocessor may apply the etch biases (40) to the shapes and transform the shapes (42) from the graphics grid to the tool grid before converting the shapes to edges (36) and labeling the edges (38).

After transforming the shapes into the tool grid, the postprocessor fills (44) the shapes. "Filling" is a term used to describe the process of reconstructing a shape out of one or more types of polygons, such as rectangles, so that the reconstructed shape is, as nearly as possible, identical to the design shape. The design shape is said to be filled with fill polygons or fill rectangles. See U.S. Patent No. 4,554,625 for an example of a method of producing non-overlapping rectangles to fill a shape. During the fill, some undesirably small rectangles, called slivers, may have been created. A sliver is a rectangle whose height or width is less than a sliver size, a size defined in the keywords (32). Slivers are usually narrower than the narrowest rectangle the e-beam tool can correctly expose. The presence of a sliver rectangle in the fill rectangles for a shape will cause distortion in the microcircuit. In some extreme cases, the presence of slivers can lead to reduced integrated circuit chip production (known as yield loss) or lead to defective integrated circuit chips that fail much sooner than would the identical chip without the presence of slivers If the same shape could be filled without creating slivers then the fill is not optimum. The fill also may not be optimum because the shape could have been filled with fewer rectangles. So, prior art methods required that each shape be filled twice: once to fill the shape and a second time to determine if the first fill was optimum. The second fill may take as much CPU time and generate as much data volume as or more than the first fill.

The fill rectangles provide the e-beam tool with control data to direct the e-beam to expose a rectangular area. See, "Method and Apparatus for Digital Control of E-Beam Pattern Writing as Applied to Subfield and Vector Equipment," in the March, 1980 IBM Technical Disclosure Bulletin page 4583 and see, "Method and Apparatus to Provide Rapid Interpretation of Digital Source Information During Electron-Beam Pattern Writing of Rectangular Shapes," in the April, 1982 IBM Technical Disclosure Bulletin page 5681 for examples of rectangle generators. U.S. Patent No. 3,956,634 discloses a method of exposing a fill rectangle by an inward spiral, which starts by tracing the perimeter of the rectangle and spiralling the beam inward until the center of the rectangle is reached.

After the fill (44), overlapping fill rectangles were cut and the overlaps were eliminated (46). Overlaps occurred when a designer used two or more overlapping simple shapes to create a more complex shape As a result of filling each of the simple shapes, the more complex shape was filled However, the fill rectangles overlapped whenever the simple shapes overlapped The overlap can be eliminated by either combining the overlapping fill rectangles into a single fill rectangle, by shrinking one of the overlapping fill rectangles, by removing the overlapping fill rectangles and filling along the overlap, or, by any other method which would result in butting fill rectangles filling the area within the complex shape. The fill rectangle overlaps may be eliminated (46) in the second pass of the fill (44) or after the second pass of the fill (44). Once the fill rectangle overlaps are eliminated (46) the fill rectangles are proximity corected (47).

Proximity correction (47) means adding control information to the fill rectangles to adjust the length of time the e-beam must expose the resist in order to print a clear image. After proximity correction, the fill data is passed (48) to the e-beam tool as Numerical Control (NC) data. NC data is actually a series of commands for the e-beam tool to control the tool to expose each rectangle. The e-beam tool writes (50) the design onto a wafer by exposing each fill rectangle onto the resist. After every fill rectangle has been written, the design shape will have been written onto the resist layer. The exposed pattern can be developed in a manner similar to to photodeveloping. The wafer, covered by the developed pattern, is then etched, implanted or otherwise similarly altered to imprint the pattern onto the wafer. So, the Numerical Control data for the e-beam tool is generated from the data generated during the fill and proximity correction. Since the computer must treat every shape as a puzzle in which the computer must both create the pieces and then fit them together during the fill (44) and, since the computer must then calculate the effect on a fill rectangle from every fill rectangle in close proximity during proximity correction (47), the fill (44) and proximity correction (47) use the most CPU time and produce the largest volume of data.

A semiconductor chip, typically, is comprised of several layers of shapes commonly known as levels and which are overlaid to form micro circuits. In the prior art, when each of these layers was created optically through a mask, these layers were known as mask levels. Some levels may still be made optically on the wafer, while the masks are made with an e-beam tool. A single design may require several levels which must be independently converted to E-beam control data. Filling each mask level is a major CPU bottleneck which may take several CPU hours with prior art fill methods. The CPU thruput times tend to increase with N**2, where N is the number of shape edges. Since each circuit is comprised of several design shapes, and since the number of edges is directly related to the number of design shapes, CPU thruput is related to the number of circuits in the design If a design is sufficiently complex, the time required to fill a single mask level would exceed the average time between CPU failures, known as the CPU's mean time to fail. Thus, the number of circuits allowed on an integrated circuit chip could be limited by factors such as the CPU's mean time to fail rather than the e-beam tool's other physical limitations when a prior art fill is used. Reducing the time required to fill a design would provide a significant improvement over slow prior art fill methods.

Also, besides being slow and awkward, prior art fill methods may lead to a unfavorable cutting of slanted edges Filling along a slanted edge may be done by placing a staircase of small rectangles along the edge. Fragmenting the edge unequally may result in edge variations from staircases of varying size being placed along each piece of the angled edge. So, the uniformity of that angled edge is often lost, degrading image quality.

OBJECTS OF THE INVENTION

It is an object of the claimed invention to improve semiconductor chip fabrication with a particle beam tool.

It is another object of the claimed invention to reduce the computer processing time required to fabricate a semiconductor chip with a particle beam tool.

It is another object of the claimed invention to reduce manufacturing yield loss in semiconductor chips fabricated with a particle beam tool.

It is still another object of the claimed invention to reduce the number of particle beam fabricated semiconductor chips which fail prematurely.

It is still another object of the claimed invention to increase the number of circuits which may be placed on a semiconductor chip fabricated by particle beam lithography.

It is still another object of the claimed invention to minimize unfavorable cutting of slanted edges.

It is still another object of the claimed invention to improve conversion of circuit design shapes into particle beam lithography tool control data.

It is still another object of the claimed invention to convert circuit design shapes into optimal control data for a particle beam tool without rearranging the control data after the first conversion.

SUMMARY OF THE INVENTION

In accordance with the objects of this invention, a more efficient method of converting circuit design shapes into control data for particle beam lithography is provided wherein design shapes are converted into optimal fill data in a single pass with slivers minimized. The fill data are fill polygons used to control a particle beam or electron beam lithography tool in direct writing the filled design shape onto a semiconductor wafer. The method comprises: (a) forming a top chain of top and side edges; (b) triggering a fill of at least part of the design shape whenever enough information exists to avoid creating slivers (enough information existing whenever a bottom edge is encountered); (c) partitioning the region in the shape which is under the top chain and above the triggering bottom edge, by: identifying all bottom edges on the shape which are colinear with the encountered bottom edge (requiring additional filling of the shape) and, identifying bottom edges below but, near the triggering bottom edge (source of future slivers); (d) filling to minimize present and future slivers; and leaving unfilled portions of the shape for filling when lower bottom edges are encountered; (e) truncating filled areas from the shape; (f) adding more side and top edges to the truncated top chain; and (g) continuing the steps of building chains of edges and filling until all shapes in the design have been filled. The fill rectangles are passed to the lithography tool and, direct the particle beam or electron beam in writing the design shapes onto the radiation sensitive layer.

BRIEF DESCRIPTION OF THE DRAWINGS

While the specification concludes with claims particularly pointing out and distinctly claiming that which is regarded as the present invention, details of the preferred embodiments of the invention may be more readily ascertained from the following technical description when read in conjunction with the following drawings wherein:

FIG. 3 shows a shape divided into quadrilaterals according to the prior art.

FIG. 5 is an example of a shape which can be divided into three rectangular quadrilaterals and filled according a prior art method.

FIG. 6A is an example of a design shape

FIGS. 6B–6F shows the shape of FIG. 6 as filled according to a prior art method

FIG. 7-7A is flow diagram of the fill method of the present invention.

TECHNICAL DESCRIPTION

First, a description of how shapes were filled by a prior art method and some examples of shapes filled by that method are provided to facilitate understanding of the present invention.

Figure 1:
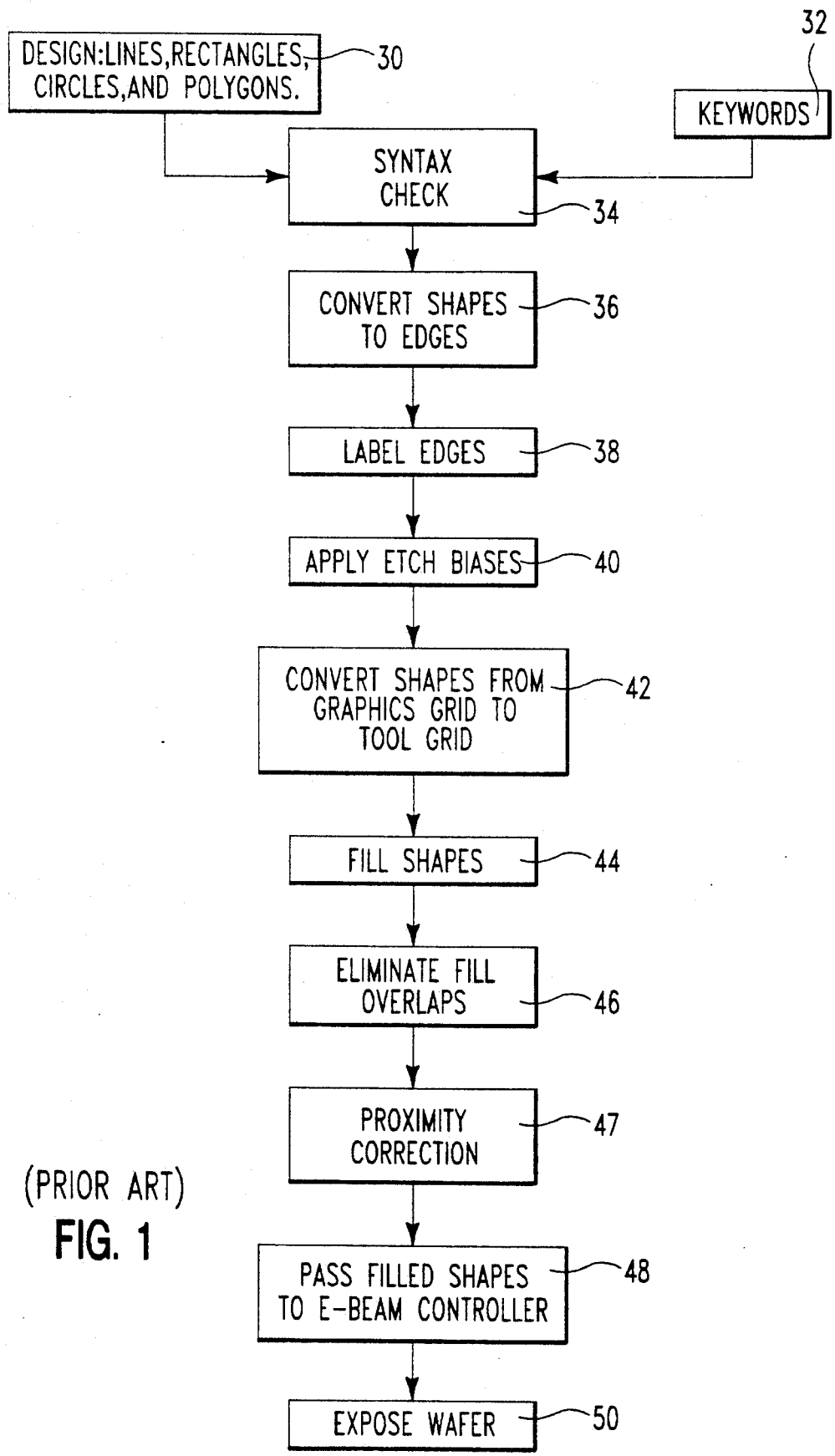
FIG. 1 is a flow diagram for converting design data into e-beam tool numerical control data.
Figure 2:
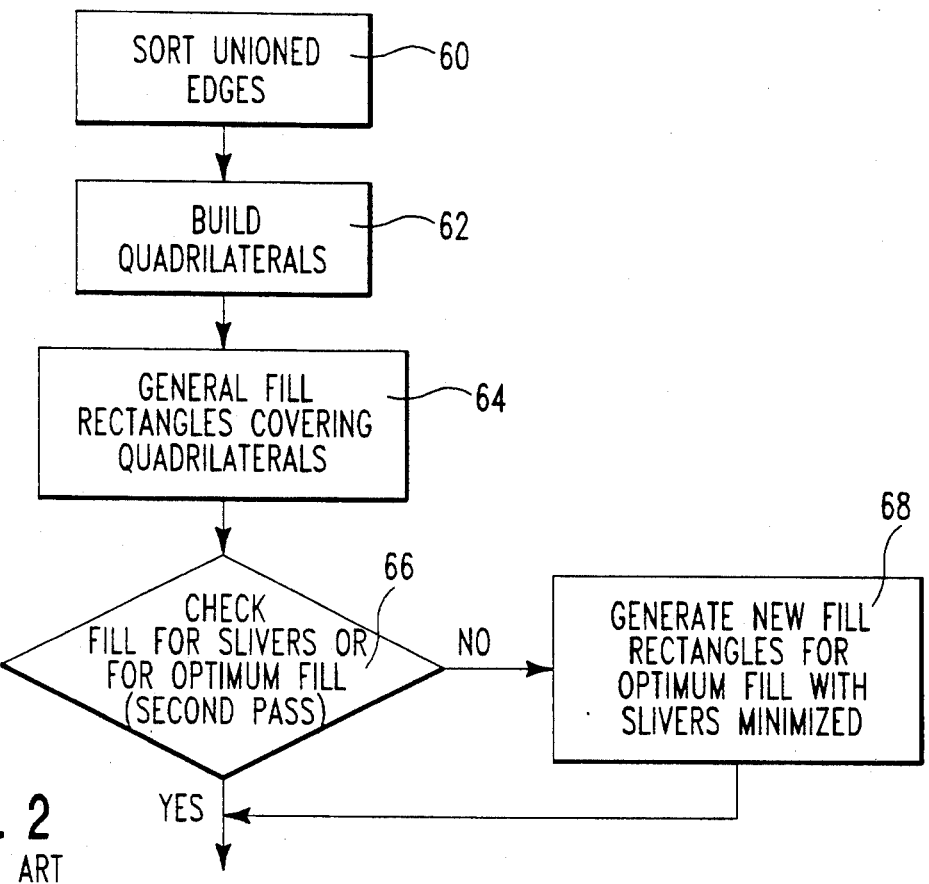
FIG. 2 is a flow diagram of a prior art fill.

FIG. 2 is a flow diagram of a prior art fill method. First the edges were sorted (60). The sorted edges were sequentially connected together, or processed, until a quadrilateral could be formed (62). The top and bottom edges of the quadrilaterals were horizontal. FIG. 3 shows shape 70 divided into quadrilaterals according to the prior art. When edges 72, 74, 76, 78, 80, 82, and 84 were processed, quadrilaterals 86, 88, and 90 were built The quadrilaterals in FIG. 3 were built such that every unique lower endpoint of a side edge (92, 94, 96, and 98) is a quadrilateral's bottom corner. Because top and bottom edges are horizontal, any bottom corner of a quadrilateral not being the lower endpoint of a side edge (100 and 102) lies on a side edge at the same Y coordinate as the first corner.

After partitioning the shape into quadrilaterals, each quadrilateral was filled with rectangles (64) by a rectangle generator. The first time a shape has been filled is known as "the first pass" because the postprocessor has passed or processed through the shape for the first time.

When an edge of a quadrilateral lies on an angle to the vertical or horizontal direction, the postprocessor covers that quadrilateral with a series of very small rectangles. These small rectangles produce a staircase of edges along the slanted or angled edge to approximate the angled edge. See U.S. Pat. No. 4,532,598 for an example of an e-beam system which fills along angled edges with a staircase of rectangles. The postprocessor uses size limits from the keywords to limit the width and height of these staircase rectangles. This staircase of edges produces a jagged edge. For example, sleeving shape 110 in FIG. 4A as taught in U.S. Pat. No. 4,717,644 and incorporated herein by reference, would first require decomposing shape 110 into quadrilaterals 112 and 114 shown in FIG. 4B. In FIG. 4C, the edges of the quadrilaterals are delineated by e-beam exposure pattern 116, which is the sleeve for shape 110. It should be noted that fully sleeving quadrilaterals 112 and 114 would lead to overlapping sleeve portions 118 and 120. Sleeve portions 118 and 120 lie within and are, therefore, internal to shape 110. Consequently, 118 and 120 are normally discarded and, as shown in FIG. 4D, sleeve 116 completely defines the perimeter of 110. Internal area 122 may be filled using optical methods, not the subject of this invention, or filled with rectangles. Alternatively, sleeve 116 could be eight sleeve rectangles with a sleeve rectangle placed along each edge of shape 110. Sleeving provides sharp edge definition and is done when the postprocessor fills the shape.

Whenever sleeving is required, lists of top and bottom edges must be maintained for proper identification of any parts of each quadrilaterals' perimeter which will require sleeves. Since the quadrilaterals' side edges are side edges of the shape, sleeve rectangles will be generated for the quadrilaterals' side edges when each quadrilateral is filled and so, lists need not be maintained for side edges With horizontal edges, however, as with 104 in FIG. 3, some edges may be internal to the shape and, therefore, would not require sleeves. Also, as with 118 in FIG. 4b, a quadrilateral's horizontal edges may be partially internal to a shape and partially on the shape's edges. The lists will, therefore, contain the portions of the quadrilateral's horizontal edges which are top and bottom edges of the shape. The height and width of the sleeve rectangles may be defined in the keywords. For example, shape 130 in FIG. 5 is divided into quadrilaterals as described above. In FIG. 5, input edges are labeled 132, 134, . . . , 154 and quadrilaterals which were generated are labeled 160, 162, and 164. Top and bottom lists for each quadrilateral would be as follows:

160 - Top list - 134
Bottom List - Empty
162 - Top list - 138, 154
Bottom List - 142, 150
164 - Top list - Empty
Bottom List - 146

Additionall when generating these top and bottom edge lists, the post processor makes two checks which may result in adding bottoms or tops to the lists. If the distance between any top edge of the shape and any bottom edge of the shape is less than a minimum keyword input, called the "split value", then the top edge is included in the top list and the bottom edge is included in the bottom list for all quadrilaterals lying between those top and bottom edges. If, for example, the Y distance between edges 134 and 146 were less than the split value, then edge 134 would be included in the top list and edge 146 would be included in the bottom list for all three quadrilateral's (160, 162, and 164). The second check determines whether top or bottom quadrilaterals are shorter than the sleeve size. This check is done while generating the top and bottom lists for quadrilaterals adjacent to the top and bottom quadrilaterals, e.g., 162. If the top or bottom quadrilateral is shorter than the sleeve size, then the respective top or bottom is included in the appropriate list of the adjacent quadrilateral. For shape 130 in FIG. 5, if quadrilaterals 160 and 164 were shorter than the sleeve height, then edge 134 would be included in 162's top list and edge 146 would be included in 162's bottom list. Sleeve rectangles are generated from these lists.

Before the fill rectangles are passed to the e-beam tool, a second pass (66) is made. The second pass (66) may be made either after filling each shape or, alternatively, after having filled every shape design. In the second pass, each shape's fill rectangles are re-examined to optimize the fill arrangement and to eliminate "slivers" by generating (68) new fill rectangles The fill may be optimized by combining slivers with other fill rectangles and by rearranging the fill to provide a fill that is most suitable to the particular e-beam tool. Although slivers cannot always be eliminated, in most instances they can be.

Figure 6C:
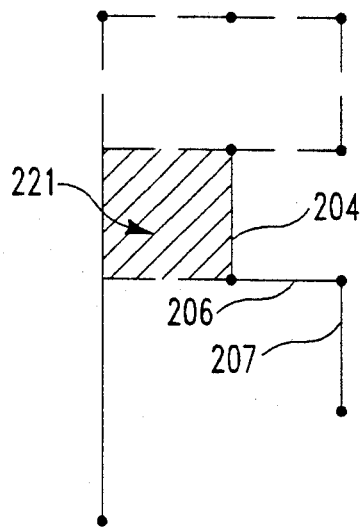
Figure 6D:
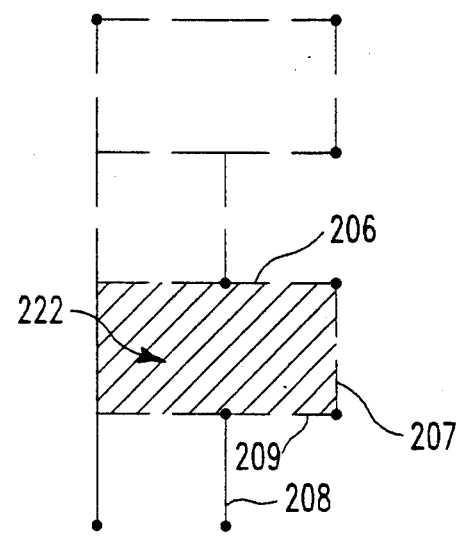
Figure 6E:
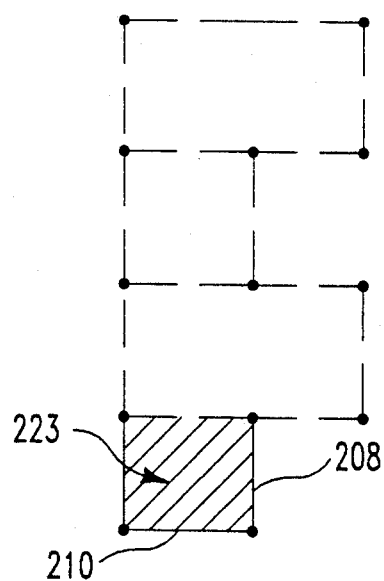
Figure 6F:
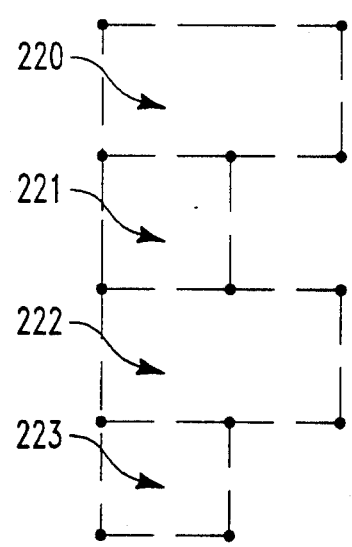

In filling shape 200 in FIG. 6A according to the prior art, slivers were created The edges of shape 200 were sorted and labeled starting with edge 201 and ending with edge 210. The sorted edges were sequentially connected together until edges 204 and 205 were added, which defined the first quadrilateral 220. Defining 220 triggered a fill that completely filled the quadrilateral, see FIG. 6B. More edges were sequentially connected until, as shown in FIG. 6C, another fill was triggered when 206 and 207 were added generating the second quadrilateral 221. Quadrilateral 221 was completely filled. If, for example, the length of edge 204 did not exceed the sliver size, then the fill rectangle for quadrilateral 221 was a sliver rectangle, i.e., a sliver was generated. Next, more edges were sequentially added until in FIG. 6D quadrilateral 222 was generated when edges 208 and 209 were added. Generating quadrilateral 222 triggered a fill and 222 was completely filled. If edge 208 was shorter than a sliver then filling 222 would lead to creating slivers when the remainder of the shape would be filled in a subsequent fill. Adding edge 210 generated the fourth quadrilateral, 223, in FIG. 6E and 223 was filled In the final step, the second pass, the filled shape (shown in FIG. 6F) was reexamined to determine if the fill was optimum or if slivers could be eliminated. If slivers were found or if the fill was not optimum, shape 200 would be filled a second time In the method of the present invention, unlike the prior art, shapes are filled in a single pass by interrogating the edges of each shape and, whenever sufficient information has been gathered on an area of a shape, filling that area.

Figure 7A:
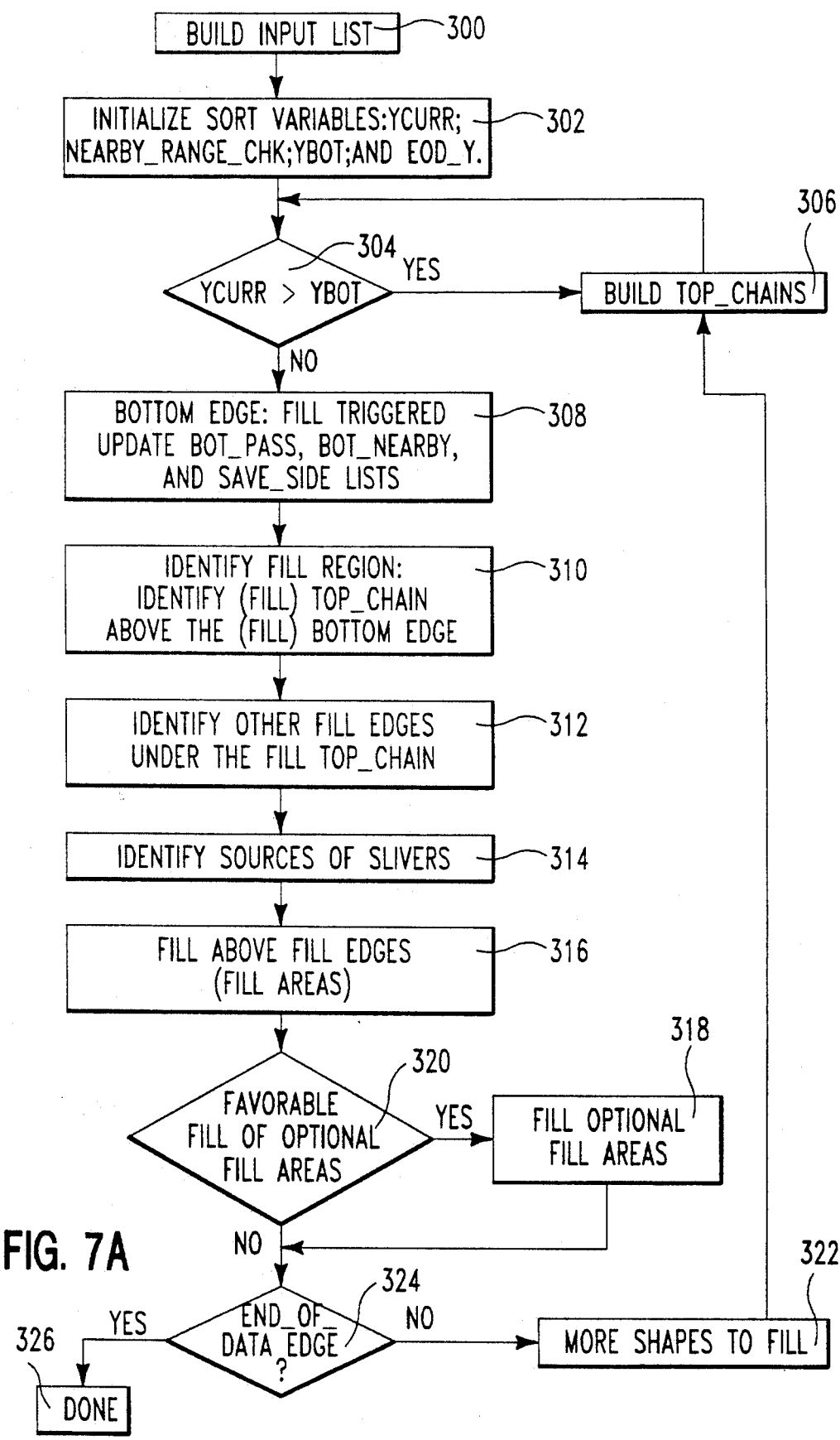
Figure 7B:
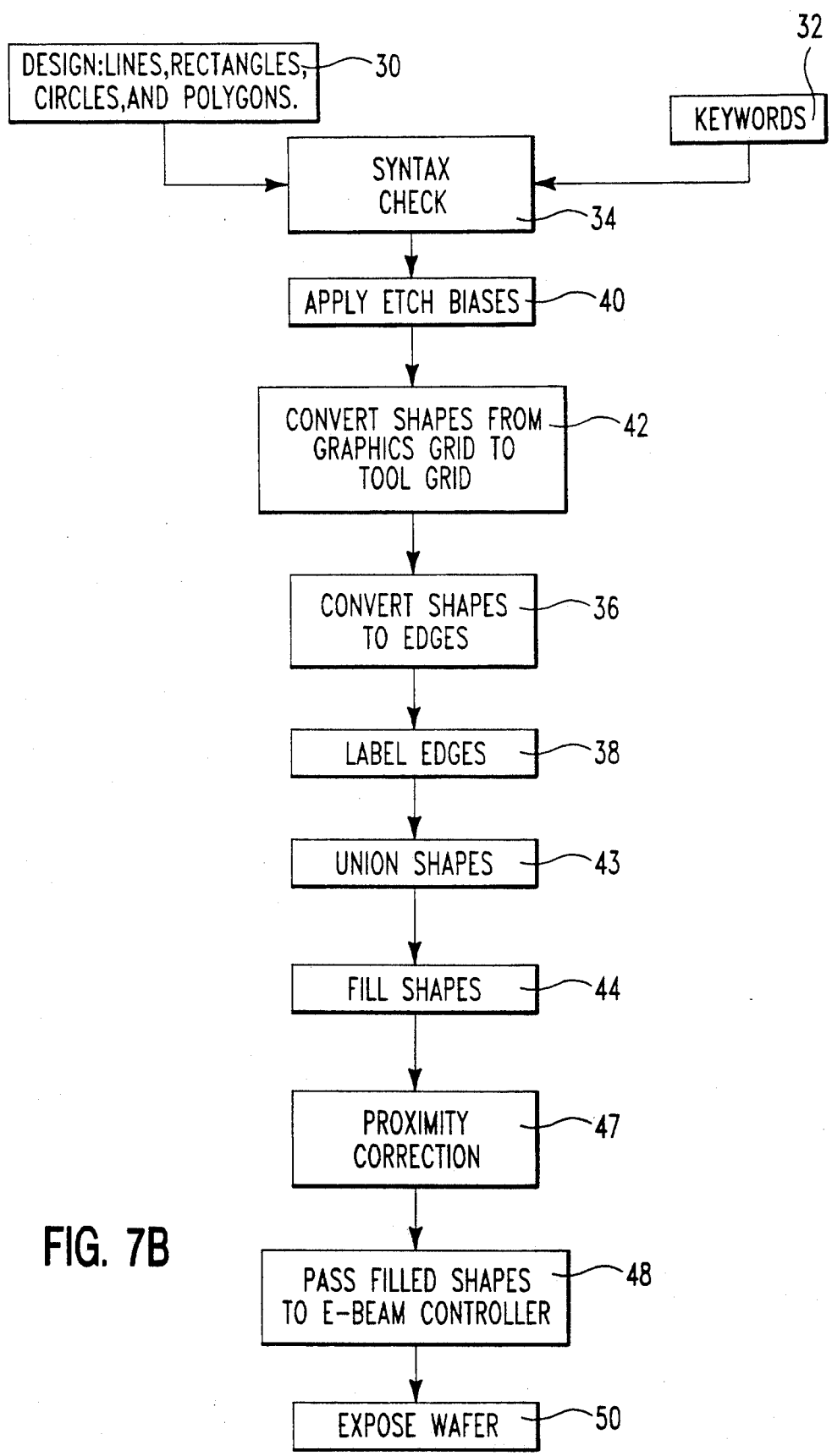
FIG. 7B is a flow diagram for converting design data into NC data according to the preferred embodiment of the present invention.

FIG. 7A is a flow diagram of the fill method of the present invention. Table 1 is programming design language (also known as psuedocode) listing and is an alternate description of the fill method of the flow diagram of FIG. 7A. FIG. 7B is a flow diagram for converting design data to NC data according to the preferred embodiment of the present invention.

In the preferred embodiment of FIG. 7B, the post processor applies the etch biases (40) to shapes and then transforms the shapes (42) from the graphics grid to the tool grid before converting the shapes to edges (36) and labeling the edges (38). After labeling the edges (38) and before filling the shapes, the shapes are "unioned" (43). "Unioning shapes" means combining two or more simple shapes into a single shape. The unioned shape may or may not be more complex. For example, two small rectangles may, when unioned, form a 6 sided polygon or form a rectangle.

After the shapes are unioned (43), they are filled according to the fill method represented in FIG. 7A and Table 1.

TABLE 1

| DCL 1 NEXTY BASED (P NEXTY) | DCL 1 NEXTBOT BASED (P_NEXTBOT), |
|---|---|
| 2 FORWARD LINK TO NEXT EDGE | 2 FORWARD LINK TO NEXT EDGE, |
| 2 * | 2 FORWARD LINK TO NEXT BOTTOM, |
| 2 EDGE_RECORD | 2 EDGE_RECORD |

```
/* FLOW */
/* INITIALIZE LISTS */
NEARBY_RANGE_CHK = RANGE TO LOOK WITHIN TO PREVENT SLIVERS;
YCURR = YSORT PT OF FIRST EDGE IN INPUT LIST; /*P_NEXTY*/
YBOT = YSORT PT OF FIRST BOTTOM EDGE IN INPUT LIST;
/*P_NEXTBOT*/
EOD_Y = YSORT PT OF END_OF_DATA EDGE;
/* MAIN LINE */
DO WHILE (YBOT > = EOD_Y); /* PROCESS UNTIL EOD IS FOUND */
    DO WHILE (YCURR > YBOT);
        CALL PROCESS_YCURR;   /* ADD LEFT, TOP, RIGHT EDGES WHOSE
                                 YSORT PT = YCURR TO TOP CHAINS*/
        YCURR = NEXTY.YSORT;  /* NEXT Y VALUE BELOW PREVIOUS YCURR*/
    END;
```

TABLE 1-continued

```
CALL PROCESS-NEARBY;      /* PREPARE BOT_NEARBY LIST FOR CHECKING
                             OF NEARBY_BOTTOMS OF YBOT*/
CALL PRCCESS_YBOT;        /* PROCESS BOTTOM EDGES WHOSE
                             YSORT PT = YBOT*/
YBOT = NEXTBOT.YSORT;     /* NEXT BOTTOM EDGE YVALUE BELOW
                             PREVIOUS ONE */
YCURR = NEXTY.YSORT;      /* IF A PARTICULAR Y VALUE HAD ALL BOTTOM
                             EDGES ON IT PROCESS_YBOT WOULD HAVE
                             CHANGED P_NEXTY */
END; /* END DO WHILE YBOT = EOD_Y */
```

Although an edge could be curved or otherwise irregular, in the preferred embodiment edges are straight lines. An edge is a part of a shape's perimeter which connects two vertices together An edge's upper left end point is the edge's sort point The upper end point is a side edge's sort point The left end point is a horizontal (top or bottom) edge's sort point. An edge's other end point is called the edge's other point. Every sort point has an X and a Y coordinate designated as the sort point's XSORT POINT and YSORT POINT. Each edge's other point has an X and a Y coordinate designated as its XOTHER POINT and YOTHER POINT. Each edge is labeled according to its location on the shape. Thus, edges are labeled as right, left, top, or bottom. Edges are also labeled as internal 116 or external 116 for sleeving, if sleeving is required. A design language representation of an edge according to the preferred emobidment is:

```
DCL 1 EDGE_RECORD,
        2 XSORT POINT,
        2 YSORT POINT,
        2 LABELING,
        2 XOTHER POINT,
        2 YOTHER POINT
```

Edges are sorted top to bottom according to YSORT POINT. Edges having the same YSORT POINT are sorted left to right according to XSORT POINT. Edges having the same YSORT POINT and XSORT POINT are sorted with side edges before top and bottom edges according to label. A design language representation of the edge sort criteria is:

YSORT PT DECREASING, XSORT PT
    INCREASING, LABELING.

Figure 8:
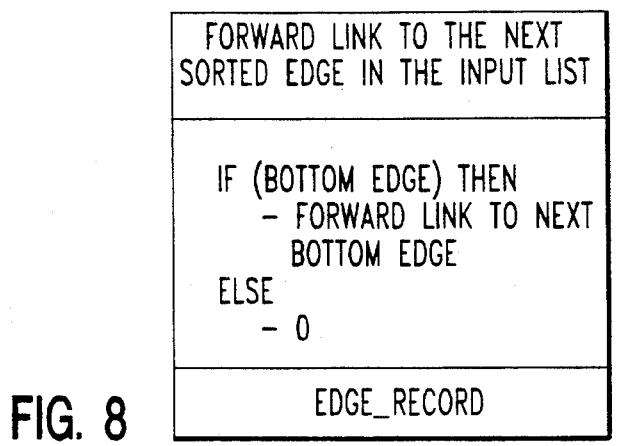
FIG. 8 is a diagrammatic representation of an INPUT list entry.
Figure 9:
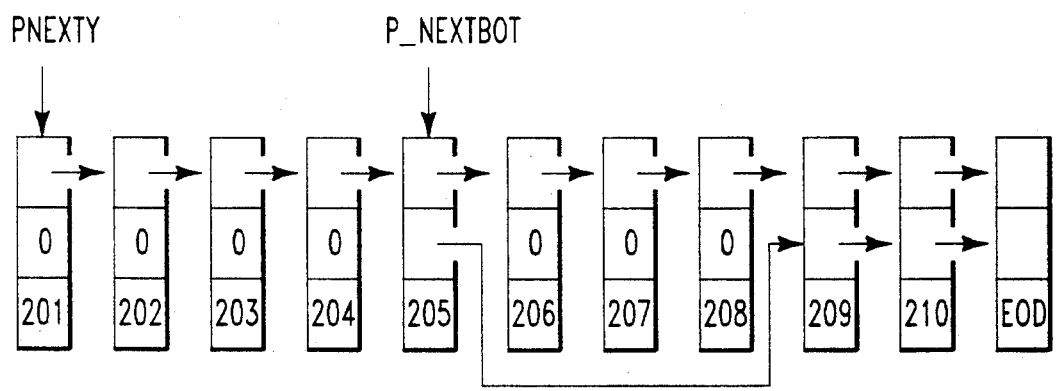
FIG. 9 is a diagrammatic representation of the INPUT list of the preferred embodiment for the sorted edges of the figure of FIG. 6.

The sorted edges are sequentially listed in a list called the INPUT list (300). FIG. 8 is a diagrammatic representation of an INPUT list entry. Each INPUT list entry contains A forward link to the next sorted edge in the INPUT list; a forward link to the next bottom edge for every bottom edge or 0 for every non-bottom edge; and an edge record. FIG. 9 is a diagrammatic representation of the INPUT list after sorting the edges of shape 200 according to the preferred embodiment.

After the edges have been sorted and entered in the INPUT list, two pointers are set. The first pointer, P_NEXTY, is initialized to point to the first edge in the INPUT list. In FIG. 9, P_NEXTY is set to point to edge 201. The second pointer, P_NEXTBOT, is initialized to point to the first bottom edge in the INPUT list. In FIG. 9, P NEXTBOT is set to point at edge 205, the first bottom edge in the INPUT list. Each edge points to the next edge in the list, e.g., 206 points to 207. Each bottom edge points to the next bottom edge in the list, e.g., 205 points to 209. An END_OF_DATA edge is placed as the last entry in the INPUT LIST. The last bottom edge from the sort (210) will have both links pointing to the END_OF_DATA edge. For convenience and clarity in the discussion below, a reference to a pointer is a reference to the edge to which the pointer is pointing.

In the preferred embodiment, after building the INPUT list, the edges in the INPUT list are sequentially processed, i.e. connected together, until enough shape information is developed to partially or fully fill a shape. However, before processing the INPUT list, four variables, NEARBY_RANGE_CHK, YCURR, YBOT, and EOD_Y, are defined (302) if no sleeving is required, otherwise it is set to the split value. NEARBY_RANGE_CHK is set equal to the sliver range keyword if no sleeving is required, otherwise it is set to the split value. YCURR is initialized to the YSORT point of the first edge in the INPUT list, edge 201's YSORT POINT. YBOT is initialized to the YSORT point of the first bottom edge in the INPUT list, edge 205's YSORT POINT. EOD_Y is set to the YSORT point of the END_OF_DATA edge in the INPUT list.

Once these four variables have been defined, the edges in the INPUT list are processed sequentially. Table 2 is a programming design language listing of how the edges in the input list are processed.

TABLE 2

```
/* SUBROUTINE */
PROCESS_YCURR: PROC;
    /* P_NEXTY PTS TO FIRST EDGE IN INPUT LIST WITH YSORT
       VALUE OF YCURR */
    /* SINCE BOTTOM EDGES AT THIS YCURR WERE ALREADY PROCESSED BY A
       PREVIOUS CALL TO PROCESS_YBOT--FORWARD LINKS TO BOTTOMS AT
       THIS YCURR HAVE BEEN REMOVED. */
    /* ADDS LEFT, TOP, RIGHT EDGES WHOSE YSORT = YCURR TO THEIR
       PROPER TOP_CHAIN OR INSERTS ANY NEW TOP_CHAINS INTO THE
       TOP-CHAIN LIST. */
    DO WHILE (NEXTY.YSORT = YCURR);  /* PROCESS TOPS, SIDES WHOSE
                                        YSORT = YCURR */
    PROCESS "EDGE COMBINATION" BASED ON P_NEXTY AND EDGES THAT FOLLOW
    P_NEXTY IN THE INPUT LIST LOOKING FOR EDGES THAT CONNECT.
    SELECT ("EDGE COMBINATION");
        WHEN (LEFT EDGE & TOP EDGE CONNECT)
```

TABLE 2-continued

```
/* P_NEXTY = LEFT EDGE - NEXT EDGE = TOP EDGE -- CONNECT */
FIND THE TOP_CHAIN WHOSE LEFTMOST EDGE CONNECTS TO THE X, Y
OTHER PT OF THE TOP EDGE AND ADD THESE EDGES TO THE LEFT
END OF THAT TOP_CHAIN.
WHEN (TOP EDGE & RIGHT EDGE CONNECT)
/* P_NEXTY = TOP EDGE - NEXT EDGE = RIGHT EDGE -- CONNECT */
FIND THE TOP_CHAIN WHOSE RIGHTMOST EDGE CONNECTS TO THE X, Y
SORT PT OF THE TOP EDGE AND ADD THESE EDGES TO THE RIGHT
END OF THAT TOP_CHAIN.
WHEN (TOP EDGE ONLY)
/*P_NEXTY = TOP EDGE--NO OTHER CONNECTION */
FIND THE TOP_CHAIN WHOSE RIGHTMOST EDGE CONNECTS TO THE X,
Y SORT PT OF THE TOP_EDGE -- NEXT TOP_CHAIN AFTER IN LIST
WILL CONNECT TO X, Y OTHER PT OF TOP EDGE. MERGE THESE TWO
TOP CHAINS INTO ONE ADDING TOP EDGE TO THE MERGED TOP_CHAIN.
WHEN (LEFT EDGE, TOP EDGE, RIGHT EDGE CONNECT)
/* P_NEXTY = LEFT EDGE, - NEXT TWO EDGES ARE TOP, RIGHT THAT
CONNECT. */
FIND PLACE IN TOP_CHAIN LIST TO INSERT THIS NEW TOP_CHAIN --
CREATE NEW TOPCHAIN AND INSERT INTO LIST. TOP_CHAIN LIST IS
ORDERED LEFT TO RIGHT.
WHEN (LEFT EDGE OR RIGHT EDGE ONLY)
/* P_NEXTY = LEFT OR RIGHT EDGE -- NO OTHER CONNECTION */
FIND TOP_CHAIN THAT CONNECTS TO THE LEFT OR RIGHT EDGE AND
ADD THAT EDGE TO THE PARTICULAR TOP_CHAIN.
OTHERWISE
END SELECT;
UPDATE P_NEXTY TO POINT TO NEXT GROUP OF EDGES -- P_NEXTY = LAST
EDGE IN "EDGE COMBINATION." FORWARD LINK -- MAY
CHANGE NEXTY.YSORT
END; /*END DO WHILE (NEXTY.YSORT = YCURR)*/
END PROCESS_YCURR;
```

The edges in the INPUT list are processed according to sort point with P_NEXTY pointing to the first edge in the list at the sort point. All edges with the sort point of PNEXTY are connected together before any edge is processed at a subsequent sort point. All of the edges in the INPUT list at a common YSORT point are processed before any edge with a lower YSORT point can be processed. As the edges are processed, YCURR is updated to hold the current value of the YSORT point of the edge being processed.

Figures 11A, 11B:
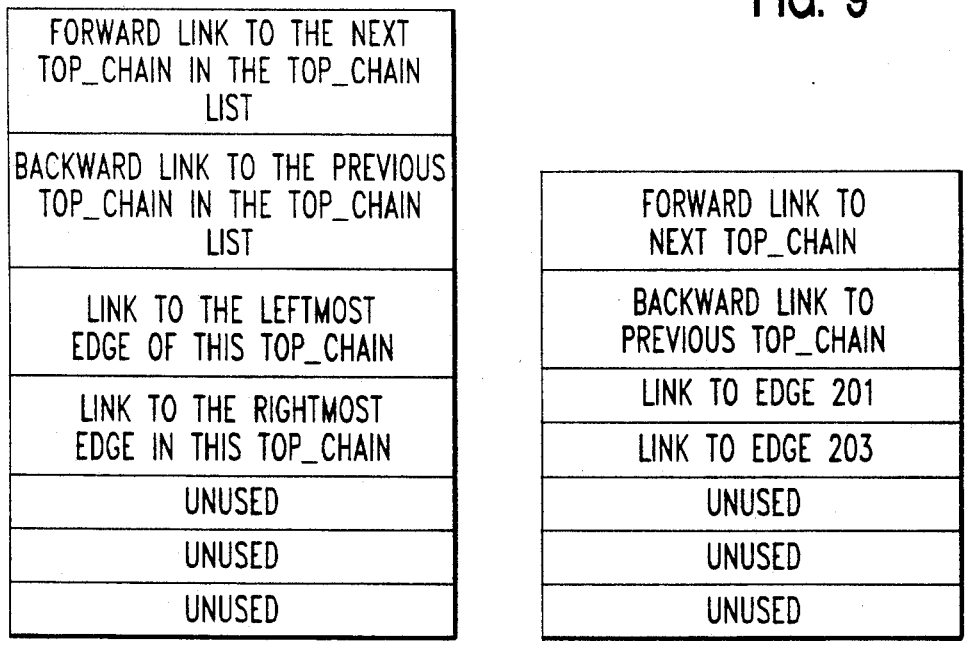
FIG. 11A is a diagrammatic representation of a TOP-CHAIN entry.
FIG. 11B is an example of a TOP CHAIN entry.
Figure 10A:
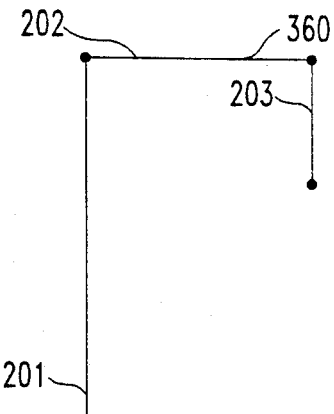
FIGS. 10.A–10H shows the shape of FIG. 6 as filled according to the preferred embodiment.

The connected edges create chains of top and side edges called TOP_CHAIN's (304). So, when the edges in INPUT list in FIG. 9 are processed according to the preferred embodiment, TOP_CHAIN 360 in figure 10a, is built from edges 201, 202, and 203. TOP_CHAIN's do not contain any bottom edges A list is created, called the TOP_CHAIN list, and each TOP_CHAIN is entered in the list. The first and last entries in the TOP_CHAIN list are dummy records called the start and end TOP CHAINS respectively. FIG. 11A is a diagrammatic representation of a TOP_CHAIN list entry. Each entry in the TOP_CHAIN list contains: a forward link to the next TOP_CHAIN in the list; a backward link to the previous TOP_CHAIN in the list; a link to the leftmost edge of the TOP_CHAIN; and a link to the rightmost edge of the TOP_CHAIN.

As indicated above, processing an edge means connecting it to other edges. An edge is connected to another edge if either end point of one edge is identical with an end point of the other edge, i.e., the first edge is linked, by its first (forward) link (see FIG. 8), to the other edge. So, when an edge is processed: if the edge is connected to the left side of a TOP_CHAIN or of another edge, the first link in the processed edge is altered; or, if the edge is connected to the right side of a TOP_CHAIN or of another edge, the processed edge's link is unchanged, and the other edge's first link is altered. Additionally, if the processed edge is the first or last edge in a TOP_CHAIN, the appropriate TOP_CHAIN link in the TOP_CHAIN entry is altered.

Therefore, individual edges in each TOP_CHAIN are linked together by a forward link starting at the leftmost edge of the TOP_CHAIN and proceeding to the rightmost edge, i.e., in order of ascending XSORT point. FIG. 11B is a diagramatic representation of the TOP_CHAIN list entry for TOP_CHAIN 360. The TOP_CHAIN entry provides the first edge in the chain through its link to the leftmost edge and the last link in the chain through its link to the rightmost edge. As indicated above, sequentially processing the edges in the INPUT list means: if the processed edge is other than a bottom edge (304), connecting that edge to subsequent side or top edges in the INPUT list to build a chain of top and side edges (306) called a TOP_CHAIN or, connecting that edge to previously built TOP_CHAIN's; if the processed edge is a bottom edge then a fill is triggered (308) and at least part of a shape is filled. As each TOP_CHAIN is built or modified, an entry is made in a TOP_CHAIN list.

Processing PNEXTY to build TOP_CHAIN's can lead to five possible connection combinations. First, when PNEXTY is a left edge and the next two edges are connecting top and right edges, then these three edges are connected and form a new TOP_CHAIN which is inserted in the TOP_CHAIN list. Second, when PNEXTY is a left edge and the next edge is a top edge, then these two edges are added to the left end of the TOP_CHAIN in the TOP_CHAIN list which has its left end at the X,Y OTHER point of the top edge. Third, when PNEXTY is a top edge and the next edge is a right edge, then these two edges are added to the right end of the TOP_CHAIN in the TOP_CHAIN list which has its right end at the XSORT and YSORT point of the top edge. Fourth, when PNEXTY is a top edge with no other edges in the list connected to it then, PNEXTY connects 2 TOP_CHAIN's together; PNEXTY is added to the right end of the TOP_CHAIN in the TOP_CHAIN list which has its right end at the XSORT and YSORT point of PNEXTY, and, the TOP_CHAIN in the TOP_CHAIN list which has its left end at the XOTHER and YOTHER point of PNEXTY is added to the right side of PNEXTY. Finally, when PNEXTY is a side edge to which the next edge does not connect, then PNEXTY is added to the side of the TOP_CHAIN in the TOP_CHAIN list which has its left or right end at the XSORT and YSORT point of PNEXTY.

Sequential processing of the edges in the INPUT list continues until a bottom edge is encountered, i.e., the YSORT point of PNEXTY is equal to YBOT. Encountering a bottom edge (308) triggers a fill, because enough information exists about the shape containing the bottom edge to fill at least part of that shape. So, when edges 204 and 205 in the INPUT list in FIG. 9 are processed, a fill is triggered because 205 is a bottom edge. Since no subsequent edges in the INPUT list can be above edge 205 in figure 10b, all of the area under TOP_CHAIN 360 above edge 205's YSORT point will be filled, either when 205 triggers the fill or, at a subsequent fill. However, to avoid creating slivers or a situation which would lead to creating slivers at future fills, more information must be gathered. Since shape 200 is not fully defined, only the part of shape 200 above edge 205 could be filled without first considering possible sources of problems at future fills. Other bottom edges (NEARBY_BOTTOM edges) on shape 200 could lead to creating slivers when those NEARBY_BOTTOM edges subsequently trigger fills. That is because the distance between YBOT and NEARBY_BOTTOM edges is less than the width of a sliver.

Figure 12:
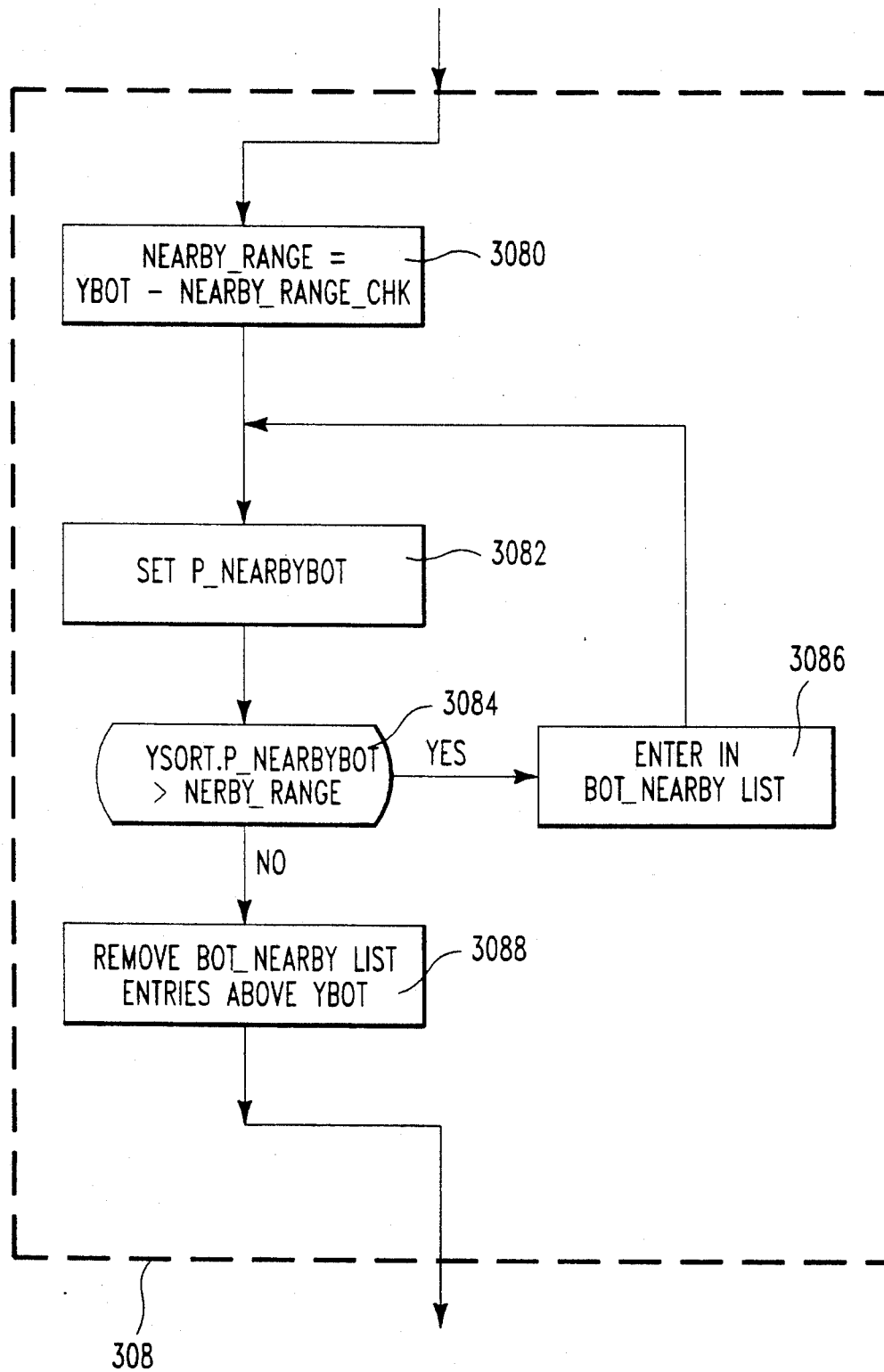
FIG. 12 is a flow diagram of how the BOT NEARBY list is built, 308 in FIG. 7.

To consider NEARBY_BOTTOM edges when a fill is triggered, a list called the BOT_NEARBY list is built and modified on each subsequent fill. Table 3 is a program design language listing of how the BOT_NEARBY list is built according to the flow diagram provided in FIG. 12. Before building the BOT_NEARBY list, NEARBY_RANGE is determined by subtracting NEARBY_RANGE_CHK value from YBOT (3080). A pointer, P_NEARBYBOT, is set (3082) to point to the first bottom edge below the last bottom edge in the BOT_NEARBY list, i.e., not in the BOT_NEARBY list. P_NEARBYBOT is checked (3084) to determine if it is below NEARBY_RANGE. If P_NEARBYBOT is below NEARBY_RANGE, then, all other bottom edges in the INPUT list are below NEARBY_RANGE and no NEARBY_BOTTOM edges are added to the BOT_NEARBY list. If P_NEARBYBOT is above NEARBY_RANGE then an entry is made (3086) in the BOT_NEARBY list and P_NEARBYBOT is set (3082) to point to the first bottom edge in the INPUT list below that BOT_NEARBY entry. Entries are made in the BOT_NEARBY list for each YSORT point between YBOT and NEARBY_RANGE at which there is a bottom edge (3086). P_NEARBYBOT is set (3082) to point below each entry as the entry is made. Each entry in the BOT_NEARBY list is the first bottom edge in the INPUT list at each such YSORT point. Y_BOT_VALUE is set to the YSORT value of the last entry in the BOT_NEARBY list. When P_NEARBYBOT points below NEARBY_RANGE, then no more bottom edges will be added until the next fill is triggered. Every entry in the BOT_NEARBY list having a YSORT point at or above YBOT has already been processed and, so, is deleted (3088) from the list. Once the BOT_NEARBY list build is complete, it contains the information required to identify NEARBY_BOTTOM edges during the fill.

TABLE 3

```
/* SUBROUTINE */
PROCESS_NEARBY: PROC;
    /* PREPARE OUR BOT_NEARBY LIST FOR
       POSSIBLE ADDITIONS OF NEARBY_BOTTOMS
       WITH NEARBY_RANGE_CHK OF YBOT */
    NEARBY_RANGE = YBOT -
    NEARBY_RANGE_CHK;
    Y_BOT_VAIUE = Y_VALUE OF LAST BOTTOM IN
    BOT_NEARBY LIST;
    DO FOR (EACH Y VALUE THAT HAS BOTTOM
        EDGES WITHIN NEARBY_RANGE) & (IS NOT
        ALREADY IN BOT_NEARBY LIST);
        ADD AN ENTRY TO BOT_NEARBY LIST FOR
        THIS Y VALUE;
        Y_BOT_VALUE =    Y VALUE OF NEXT
                         BOTTOMS BELOW PRE-
                         VIOUS Y_BOT_VALUE;
        IF Y_BOT_VALUE = BELOW NEAR-
        BY_RANGE THEN LEAVE;
        ELSE;
    END;
END PROCESS_NEARBY;
```

Figure 10B:
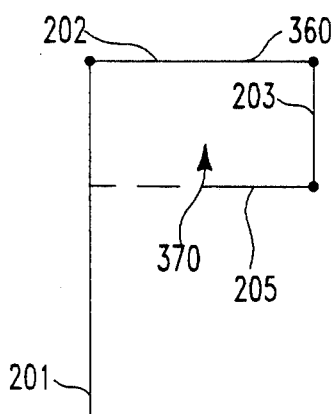

After building the BOT_NEARBY list, the region to be filled must be determined (310). P_NEXTBOT points to the bottom edge that triggered the fill, which is also the first bottom edge in the INPUT list with its YSORT point equal to YBOT. P_NEXTBOT is entered as the first entry in a list called the BOT_PASS list (308). The single TOP_CHAIN in the TOP_CHAIN list over P_NEXTBOT is identified (310) as the fill TOP_CHAIN. So, TOP_CHAIN 360 is identified as the TOP_CHAIN over edge 205. As noted above, the region under the fill TOP_CHAIN above YBOT is fully defined. That fully defined region is a fill region and the bottom edge that triggered the fill is a fill edge. Fill region 370 in FIG. 10B is the region under TOP_CHAIN 360 and above the YSORT point of edge 205. Only areas in fill region 370 may be filled during the fill triggered by edge 205. Once the fill region has been determined, it must be partitioned into areas which shall be filled (fill areas) and areas which may be filled (optional fill areas). Since a shape may have more than one bottom edge at any YSORT point, when one of those bottom edges triggers a fill, they (the shapes's bottom edges at YBOT) are all fill edges and are identified before the fill region is partitioned. So, all other bottom edges at YBOT under the fill TOP_CHAIN are identified (312) as fill edges and added to the BOT_PASS list. In the example, however, shape 200 only has one bottom edge at any YSORT point.

Since the sort point for a side edge is the edge's upper end point, fill edges (205) may have side edges (204) extending downward from either end. Because these side edges are connected to a bottom edge they cannot be connected to a TOP_CHAIN before the fill. Therefore, before the fill, every side edge connected to a fill edge having the same sort point as the fill edge is listed in a SAVE_SIDE list. So, edge 204 is placed in the SAVE_SIDE list.

In considering NEARBY_BOTTOM edges, it is evident that not every bottom edge in the BOT_NEARBY list can cause problems. Filling the entire fill region would create slivers only above the NEARBY_BOTTOM edges that are part of the shape being filled and only above those NEARBY_BOTTOM edges that are either partially or fully below the fill TOP_CHAIN. All NEARBY_BOTTOM edges under the fill TOP_CHAIN, are identified (314) from the BOT_NEARBY list and added to the BOT_PASS list. In the preferred embodiment, the TOP_CHAIN list, the BOT_PASS list, the BOT_NEARBY list, and the SAVE_SIDE list, have entries of identical size so that entries may be passed between lists during a fill.

Figure 10C:
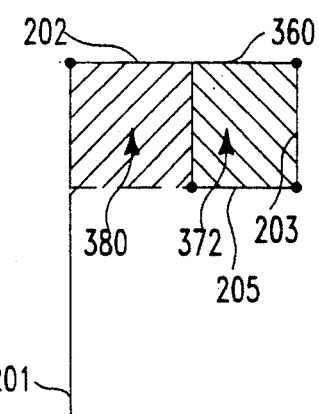

Once the fill region (310), the fill edges (312), and possible sources of future slivers have been defined, enough data has been processed to minimize (314) sliver creation in or below the fill region. So, the fill TOP_CHAIN and the BOT_PASS list are passed to the rectanL. gle generator. TOP_CHAIN 360 and the BOT_PASS list, consisting of edge 205, are passed to the rectangle generator. Any area in the fill region above a fill edge is a fill area and is filled by the rectangle generator (316). Area 370 in FIG. 10B is a fill area. Any area in the fill region which is not a fill area, is an optional fill area and may be filled (318) if conditions are favorable (320). Conditions are favorable (320) for filling optional fill areas if doing so does not create slivers or does not lead to creating slivers. Slivers could be created by filling an optional fill area if part or all of the optional area were shorter than a sliver. Filling an optional fill area could lead to creating slivers if a NEARBY_BOTTOM edge is partially or completely below the optional fill area. Parts of the optional fill areas where conditions are favorable are favorable optional fill areas. Parts of the optional fill areas where conditions are not favorable are unfavorable optional fill areas. Occasionally, a sliver will be created regardless of whether or not an optional fill area is filled. In this circumstance, the optional fill area may be treated as a favorable optional fill area or treated as an unfavorable optional fill area. However, in the preferred embodiment, a comparison is made of the two alternative slivers which would be created by filling or not filling, and, based on that comparison the alternative which produces the largest sliver area is selected. Area 380 in FIG. 10C is an optional fill area. So, the rectangle generator must fill the fill area 372 and may partially or completely fill optional fill area 380. Alternatively, optional fill area 380 may be left unfilled for filling at a later bottom edge.

Figure 10D:
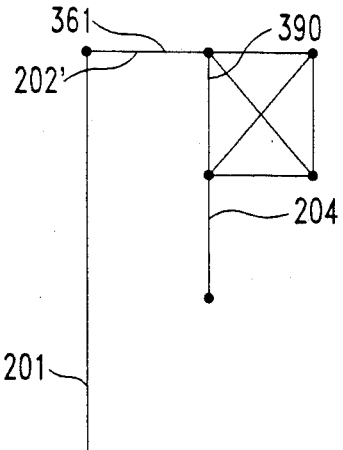

If the shape had been completely filled, then no TOP_CHAIN would be returned to the TOP_CHAIN list. If part of the shape remains unfilled then the fill TOP_CHAIN must be truncated and returned to the TOP-CHAIN list. So, the portions of the fill TOP_CHAIN which border filled areas are truncated from the fill TOP_CHAIN by removing from the fill TOP_CHAIN edges or portions of edges that bordered filled areas. After truncation, the portion or portions of the fill TOP_CHAIN that remain may need to be further altered before being returned to the TOP_CHAIN list. In FIG. 10d, TOP_CHAIN 360 was truncated to edges 201 and 202' because optional fill area 380 was left unfilled.

When a TOP_CHAIN is truncated the part of the shape's perimeter which borders the filled area is removed. Removing part of the perimeter creates a gap in the perimeter internal to the shape along the internal side of the filled area. Connecting edges must be created to fill the gaps in the fill TOP_CHAIN. Connecting edges are internal edges because they are internal to the shape being filled. In the preferred embodiment connecting edges are top or side edges only. Connecting edges connect the truncated fill TOP_CHAIN to an end of a fill edge so that, the fill TOP_CHAIN's borders all unfilled area and no longer borders any filled area. Connecting edges also connect the sides in the SAVE_SIDE list to the fill TOP_CHAIN. Truncating TOP_CHAIN 360 in FIG. 10C created a gap between the truncated TOP_CHAIN and edge 204. Connecting side edge 390 is connected to truncated TOP_CHAIN 360 at 202' to form a new partial TOP_CHAIN.

Before returning to process the edges in the INPUT list, the side edges in the SAVE_SIDE list must be processed. Since the side edges in the SAVE_SIDE list were connected to fill edges before the fill, they will be connected to connecting edges after the fill. So, edge 204 was connected to edge 390 in figure 10d forming TOP_CHAIN 361 from edges 201, 202', 390 and 204. Newly formed TOP_CHAIN 361 is returned to the TOP_CHAIN list.

If no software sleeving was required, 390 and 204 would have been combined into a single edge. If sleeving was to be done, then 390 would not have a sleeve rectangle placed along it. Before processing subsequent edges from the INPUT list, P_NEXTBOT is updated. P_NEXTBOT is set to point to the enxt bottome dges in the INPUT list which is also the first unprocessed bottom edges in the list. Initially, the next bottom edge is also the first bottom edge in the INPUT list. Table 4 is a program design language listing of what is done when a fill is triggered relative to the flow diagram of FIG. 7.

TABLE 4

```
/* SUBROUTINE */
PROCESS_YBOT: PROC;
/* P_NEXTBOT PTS TO THE FIRST BOTTOM EDGE FOR THIS
   YSORT VALUE (YBOT) IN THE INPUT LIST */
/* PROCESS BOTTOM EDGES AT YBOT - WE CAN IDENTIFY BOTTOM EDGES
   BY THE -- FORWARD LINK TO NEXT BOTTOM -- FIELD */
/* BUILDS THE BOT_PASS LIST OF BOTTOMS AT YBOT AND
   NEARBY_BOTTOMS UNDER A PARTICULAR TOP_CHAIN TO PASS
   TO THE RECTANGLE GENERATION PROGRAMS. */
   DO WHILE (NEXTBOT.YSORT = YBOT);
     PROCESS "BOTTOM EDGE SITUATION" BASED ON P_NEXTBOT AND THE
     EDGE(S) THAT COULD CONNECT (BEFORE AND/OR AFTER P_NEXTBOT IN
     THE INPUT LIST). STORE P_NEXTBOT IN BOT_PASS LIST.
     FIND THE TOP_CHAIN "OVER" P_NEXTBOT.
     FIND ANY OTHER BOTTOMS AT YBOT THAT ARE UNDER THIS TOP_CHAIN.
     ADD ANY ATTACHED SIDE (LEFT, RIGHT) EDGES THAT ATTACH TO BOT-
     TOMS IN BOT_PASS AT YBOT TO SAVE_SIDE LIST.
     PROCESS THRU BOT_NEARBY LIST TO ADD ANY UNIQUE OR PIECES OF
     NEARBY_BOTTOMS TO BOT_PASS LIST.
     CALL RECTANGLE GENERATING PROGRAMS
       (CALL RECTANGLE GENERATING PROGRAMS PASSING
        THE TOP_CHAIN AND BOT_PASS LIST. THESE
```

TABLE 4-continued

```
PROGRAMS WILL FILL ENTIRELY ABOVE ANY BOTTOM
IN BOT_PASS LIST AT YBOT. ANY OTHER AREA
UNDER THE TOP_CHAIN BUT NOT DIRECTLY ABOVE A
BOTTOM IN BOT_PASS LIST AT YBOT IS AN
"OPTIONAL" AREA TO BE FIILED IF "FAVORABLE"
RECTANGLE GENERATIONS EXIST. "FAVORABLE"
RECTANGLE GENERATION IS ABSENCE OF SLIVERS AT
THIS POINT AND FUTURE POINTS. WHAT IS
RETURNED IS THE UPDATED TOP_CHAIN(S) TO
REFLECT THE PARTIALLY FILLED TOP_CHAIN SENT.
IF THE TOP_CHAIN SENT IS TOTALLY FILLED THEN NO
TOP_CHAIN WILL BE RETURNED.)
ATTACH ANY CONNECTING SIDE EDGES IN SAVE_SIDE LIST
TO TOP_CHAIN(S) RETURNED.
UPDATE P_NEXTBOT TO POINT TO THE NEXT BOTTOM EDGE --
P_NEXTBOT = NEXTBOT.FORWARD LINK TO NEXT BOTTOM --
MAY CHANGE NEXTBOT.YSORT.
END; /* END DO WHILE (NEXTBOT.YSORT = YBOT) */
END PROCESS_YBOT;
```

If the next bottom edge is above the END_OF_DATA edge, then processing continues (322) on the edges in the INPUT list. If the next bottom edge were the END_OF_DATA edge then the level would have been completely filled and processing would have ended (324).

Figure 10E:
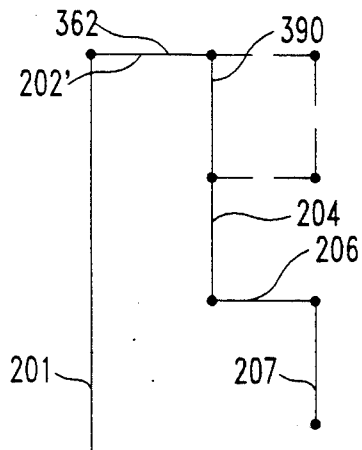
Figure 10F:
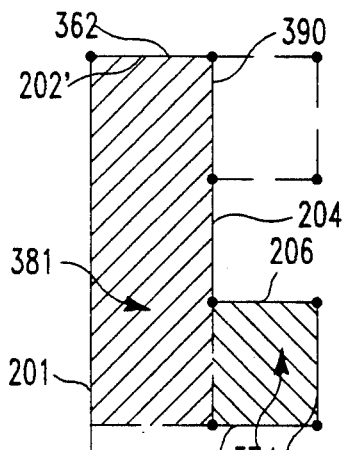

For the example, shape 200 was to be sleeved, so, edge 204 was removed from the SAVE_SIDE list and P_NEXTBOT was pointed to edge 209. The next 2 edges processed were 206 and 207, a top and a side edge. The TOP_CHAIN list was searched to find the TOP_CHAIN (361) that connected to 206, and edges 206 and 207 were added to the rightmost side of TOP_CHAIN 361. FIG. 10e shows resulting TOP_CHAIN 362 which was placed in the TOP_CHAIN list. When edges 208 and 209 were processed, bottom edge 209 triggered a fill. The TOP_CHAIN list was searched to find the TOP_CHAIN over bottom edge 209. TOP_CHAIN 362 was identified and edge 208 was placed in the SAVE SIDE list. Since bottom edge 210 was within the nearby range of edge 209, edge 210 was identified as a NEARBY_BOTTOM edge and added to the BOT PASS list. TOP_CHAIN 362 and BOT_PASS list edges 209 and 210 were passed to the rectangle generator. In FIG. 10f the rectangle generator filled fill area 374. Optional fill area 381 was not filled because doing so would have led to an unfavorable fill above NEARBY_BOTTOM bottom edge 210. Therefore, 381 was an unfavorable optional fill area. The fill region was partitioned into the areas of fill area 374 and unfavorable optional fill area 381. With only fill area 374 filled, the TOP_CHAIN was truncated to 201, 202', 390, 204 and in FIG. 10g another connecting side edge, 391, had to be added. The TOP_CHAIN consisting of edges 201, 202', 390, 204 and 391 was returned to the TOP_CHAIN list.

Figure 10G:
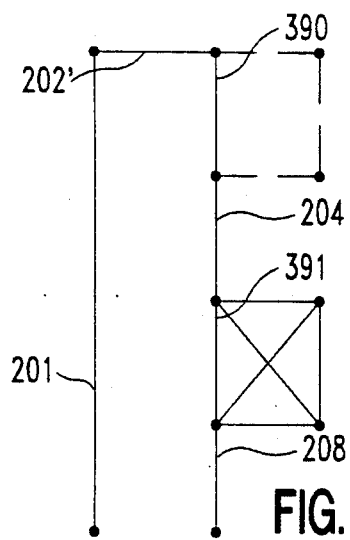
Figure 10H:
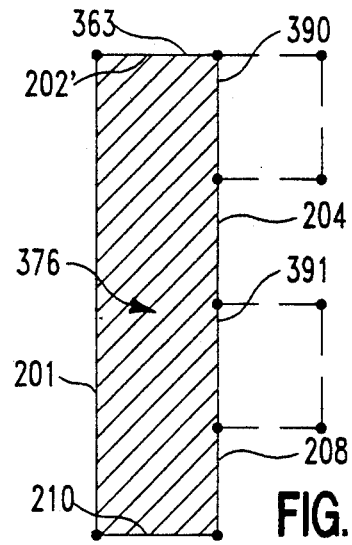

INPUT list processing continued and TOP_CHAIN 363 in FIG. 10g was built when edge 208 was added to the truncated TOP_CHAIN. TOP_CHAIN 363 was placed in the TOP_CHAIN list. Again, if no software sleeving was required, then edges 390, 204, 391 and 208 would be combined into a single edge. Processing bottom edge 210, the final bottom edge before the END_OF_DATA edge, triggered a fill. The TOP_CHAIN list was searched to find TOP_CHAIN 363, the TOP_CHAIN over bottom edge 210. Since edge 210 was the entire bottom for TOP_CHAIN 363, the entire fill region was a fill area. TOP_CHAIN 363 and BOT_PASS edge 210 were passed to the rectangle generator. The fill area, 376 in FIG. 10h, completely covered the fill region and, so, the remainder of the shape was filled. No TOP_CHAIN was returned. P_NEXTBOT was set to point to the END_OF_DATA edge. The fill was done (326) in a single pass. Every bottom edge on every shape in the design was filled with fill rectangles and, therefore, every shape had been filled.

The fill rectangles would be converted to commands used to control the e-beam tool to write the design onto a radiation sensitive layer on a semiconductor wafer. In contrast to the prior art fill method, the shape of FIG. 6, when filled according to the preferred embodiment, had slivers minimized and an optimum fill in a single pass. Consequently, because the presence of slivers is minimized in shapes filled according to the preferred embodiment, both manufacturing yield loss and premature chip failure are minimized. Also, since the time required to post process a design according to the preferred embodiment is reduced, more shapes (and as a result more circuits) may be placed on a semiconductor chip.

As noted above, the prior art fill can lead to unfavorable cutting of slanted edges. For example, shape 400 in FIG. 13A has an angled edge (402) and FIG. 13B depicts how shape 400 would be filled by the prior art fill method. Edge 402 is segmented at points 404 and 406. Each of the resulting edge segments is a different size, and triangular areas 408, 410, and 412 are unequal. A fill of one triangular area is different than a fill of another. If the fill had resulted in segmenting edge 402 into equal segments, then the same fill staircase could be used for each triangular area and the resulting edge would be uniform.

The preferred embodiment provides a fill which may be altered to avoid unfavorable cutting of angled edges. Filling shape 400 according to the preferred embodiment produced the fill of FIG. 13C. Edge 402 was segmented into 4 equal segments at points 420, 422, and 424. Triangular areas 426, 428, 430, and 432 are identical.

The same fill used for 426 could be stored, recalled" and then repeated for 428, 430, and 432.

While what is considered to be the preferred embodiment of the invention is herein described, variations and modifications thereof will occur to those skilled in the art. Therefore, it is intended that the appended claims shall be construed to include the preferred embodiment and all such variations and modifications in form and detail that fall within the spirit and scope of the invention.

I claim:

1. A system for decomposing a two dimensional shape having a plurality of edges into a plurality of fill polygons, said method comprising:

connecting means for connecting side and top said edges together, said connected edges forming a top chain of edges;

means for adding to said top chain a bottom edge, said bottom edge defining a bottom and said top chain defining a top of a fill region;

partitioning means for partitioning said fill region into a plurality of areas, said areas being comprised of fill areas and optional fill areas, said optional fill areas being comprised of favorable optional fill areas and unfavorable optional fill areas, said unfavorable optional fill areas being further comprised of any optional fill area located above a bottom edge by less than a minimum distance and, any optional fill area being smaller than a minimum size;

filling means for generating at least one fill polygon within said fill region, said fill polygons filling said fill areas and said favorable fill areas; and truncating means for truncating from said top chain all portions of said side and top edges bordering filled areas, such that all remaining said side and top edge portions form one or more top chains of edges.

2. The system of shape decomposition of claim 1 further comprising sleeving means for generating sleeve rectangles when any said fill polygon is generated.

3. The system of claim 1 further comprising sorting means for sorting said plurality of edges.

4. The system of claim 1 further comprising exposing means for exposing a radiation sensitive layer according to said fill polygons 5. A method of shape decomposition for decomposing a two dimensional shape having a plurality of edges into a plurality of fill polygons, said method comprising the steps of:

a. connecting side and top said edges together, said connected edges forming a top chain of edges b. adding to said top chain a bottom edge, said bottom edge defining a bottom and said top chain defining a top of a fill region;

c. partitioning said fill region into a plurality of areas, said areas being comprised of fill areas and optional fill areas, said optional fill areas being comprised of favorable optional fill areas and unfavorable optional fill areas, said unfavorable optional fill areas being further comprised of any optional fill area located above a bottom edge by less than a minimum distance and any optional fill area being smaller than a minimum size;

d. generating at least one fill polygon within said fill region, said fill polygons filling said fill areas and said favorable fill areas:

e. truncating from said top chain all portions of said side and top edges bordering filled areas, all remaining said side and top edge portions forming one or more top chains of edges;

f. adding top and side edges to said top chains; and, g. repeating steps b through f until said shape is covered by fill polygons 6. The method of shape decomposition of claim 5, further comprising the step of identifying sleeve edges when any said fill polygon is generated.

7. The method of shape decomposition of claim 5 wherein said polygons are rectangles.

8. A method of exposing a radiation sensitive layer to at least one two dimensional shape having a plurality of connected edges, said method comprising the steps of:

sorting said edges;

filling said shape with fill polygons, said fill polygons determined by the steps of: a connecting side and top said sorted edges together, said connected edges forming a top chain of edges, b. adding to said top chain at least one bottom edge, said bottom edge defining a bottom and said top chain defining a top of a fill region, c. partitioning said fill region into a plurality of areas, said areas being comprised of fill areas and optional fill areas, said optional fill areas being comprised of favorable optional fill areas and unfavorable optional fill areas, said unfavorable optional fill areas being further comprised of any optional fill area located above a bottom edge by less than a minimum distance and any optional fill area smaller than a minimum size, d. generating fill polygons in said fill region, said fill polygons filling said fill area and said favorable fill areas, said unfavorable fill areas remaining unfilled, e. truncating from said top chain all portions of said side and top edges bordering filled areas, all remaining said side and top edge portions forming one or more top chains of edges, and f. adding top and side said sorted edges to said top chains; and, repeating steps b through f until said shape is covered by fill polygons.

9. The method of exposing a radiation sensitive layer to at least one two dimensional shape of claim 8, further comprising the step of identifying sleeve edges when any said fill polygon is generated.

10. The method of exposing a radiation sensitive layer to at least one two dimensional shape of claim 9, further comprising the step of: exposing said layer to radiation according to said identified sleeve edges; and exposing said layer to radiation according to said fill polygons.

11. The method of exposing a radiation sensitive layer to at least one two dimensional shape of claim 8, further comprising the steps of exposing said layer to radiation according to said fill polygons.

12. The method of exposing a radiation sensitive layer to at least one two dimensional shape of claim 8, wherein said polygons are rectangles.

13. A method of exposing a radiation sensitive layer to at least one two dimensional shape having a plurality of connected edges, said method comprising the steps of: sorting said edges according to a sort point on each said edge, said sort point being the upper end of each side said edge and the left end of each horizontal said edge, said sort being in descending order from: top to bottom, left to right, and side before horizontal, said horizontal edges being top or bottom edges; filling said shape with fill rectangles, said fill rectangles determined by the steps of:

a. connecting side and top said sorted edges together in sequential order until a bottom edge is encountered, said connected edges forming a top chain of edges, b. adding to said top chain said encountered bottom edge and any of said bottom sorted edges located under said top chain and lying colinear with said encountered bottom edge, said bottom edges being fill edges, said fill edges defining a bottom and said top chain defining a top of a fill region, c. adding to a save side list every said side edge being attached at its sort point to said fill edges, d. adding to a nearby bottom list, all bottom said sorted edges having a sort point within a maximum distance below said fill edges, said listed bottom edges being nearby bottoms, e. partitioning said fill region into a plurality of areas, said areas being comprised of fill areas and optional fill areas, said fill areas being above a fill edge and said optional fill areas being comprised of favorable optional fill areas and unfavorable optional fill areas, said unfavorable optional fill areas being further comprised of any optional fill area located above a nearby bottom, and any optional fill area shorter than a minimum height, f. generating fill rectangles, said fill rectangles filling said fill areas and said favorable optional fill areas, said unfavorable optional fill areas remaining unfilled, g. truncating from said top chain any portion of any said edge bordering a fill rectangle, h. adding to said top chain connecting edges, said connecting edges closing gaps in said top chain, said gaps bordering unfilled optional areas, i. adding to said top chain all edges listed in said saved side list, and j. adding top and side said sorted edges to said top chain in..sequential order until a bottom edge is encountered; and repeating steps b through f until said shape is covered by fill rectangles.

14. The method of exposing a radiation sensitive layer to at least one two dimensional shape of claim 13, further comprising the step of identifying sleeve edges when any said fill rectangle is generated.

15. The method of exposing a radiation sensitive layer to at least one two dimensional shape of claim 14, further comprising the steps of:

exposing said layer to radiation according to said identified sleeve edges; and exposing said layer to radiation according to said fill rectangles.

16. The method of exposing a radiation sensitive layer to at least one two dimensional shape of claim 13, further comprising the step of exposing said layer to radiation according to fill rectangles.

17. A semiconductor device having at least one two dimensional shape, said shape having a plurality of connected edges and being made by a lithographic method comprising the steps of: sorting said edges; filling said shape with fill polygons, said fill polygons determined by the steps of:

a. connecting side and top said sorted edges together, said connected edges forming a top chain b. adding to said top chain a bottom edge, said bottom edge defining a bottom and said top chain defining a top of a fill region, c. partitioning said fill region into a plurality of areas, said areas being comprised of fill areas and optional fill areas, said optional fill areas being comprised of favorable optional fill areas and unfavorable optional fill areas, said unfavorable optional fill areas being further comprised of any optional fill area located above a bottom edge by less than a minimum distance and any optional fill area shorter than a minimum height, d. generating fill polygons in said fill region, said fill polygons filling said fill areas and said favorable optional fill areas, said unfavorable fill areas remaining unfilled, e. truncating from said top chain all portions of said side and top edges bordering filled areas, all remaining said side and top edge portions forming one or more top chains of edges, and f. adding top and side said sorted edges to said top chains; and repeating steps b through f until said shape is covered by fill polygons 18. The semiconductor device of claim 17 wherein the process further comprises the step of identifying sleeve edges when any said fill polygon is generated.

19. The semiconductor device of claim 18 wherein the method further comprises the steps of: exposing said layer to radiation according to said identified sleeve edges; and exposing said layer to radiation according to said fill polygons.

20. The semiconductor device of claim 17 wherein the process further comprises the step of exposing said fill polygons.

21. The semiconductor device of claim 17 wherein said polygons are rectangles.

22. A semiconductor device having at least one two dimensional shape, said shape having a plurality of connected edges and being made by a lithographic method comprising the steps of:

sorting said edges according to a sort point on each said edge, said sort point being the upper end of each side said edge and the left end of each horizontal said edge, said sort being in descending order from:

top to bottom, left to right, and side before horizontal, said horizontal edges being top or bottom edges;

filling said shape with fill rectangles, said fill rectangles determined by the steps of:

a. connecting side and top said sorted eges together in sequential order until a bottom edge is encountered, said connected edges forming a top chain of edges, b. adding to said top chain said encountered bottom edge and any bottom said sorted edges located under said top chain and lying colinear with said encountered bottom edge, said bottom edges being fill edges, said fill edges defining a bottom and said top chain defining a top of a fill region, c. adding to a save side list every side said edge having its sort point attached to any said fill edge, d. adding to a nearby bottom list all bottom said sorted edges having a sort point within a maximum distance below said fill edges, said listed bottom edges being nearby bottoms, e. partitioning said fill region into areas, said areas being comprised of fill areas and optional fill areas, said fill areas being located above a fill edge and said optional fill areas being comprised of favorable optional fill areas and optinal fill areas, said unfavorable optional fill areas being further comprised of any optional fill area located above a nearby bottom and any optional fill area shorter than a minimum height, f. generating fill rectangles, said fill rectangles filling said fill areas and said favorable optional fill areas, said unfavorable optinal fill areas remaining unfilled, g. truncating from said top chain any portion of any edge bordering a fill rectangle, h. adding to said top chain connecting edges, said connecting edges closign gaps in said top chain, said gaps bordering unfilled optional areas, i. adding to said top chain all edges listed in said saved side list, and j. adding top and side said sorted edges to said top chain in sequential order until a bottom edge is encountered; and repeating steps b through j until said shape is covered by fill rectangles.

23. The semiconductor device of claim 22 wherein the process further comprises the step of identifying sleeve edges when any said fill rectangle is generated.

24. The semiconductor device of claim 23 wherein the process further comprises the steps of:
   exposing said layer to radiation according to said identified sleeve edges; and
   exposing said layer to radiation according to said fill rectangles.

25. The semiconductor device of claim 22 wherein the process further comprises the step of exposing said layer to radiation according to said fill rectangles.

* * * * *

UNITED STATES PATENT AND TRADEMARK OFFICE
CERTIFICATE OF CORRECTION

PATENT NO. : 5,159,201

DATED : October 27, 1992

INVENTOR(S) : Joseph B. Frei

It is certified that error appears in the above-identified patent and that said Letters Patent is hereby corrected as shown below:

On the title page, Item [54] and Col 1 line 1 "DECOMPOSITON" should read --DECOMPOSITION--

Column 1, line 33, "used to expose to an" should read --used to expose an--

Figure 4A:
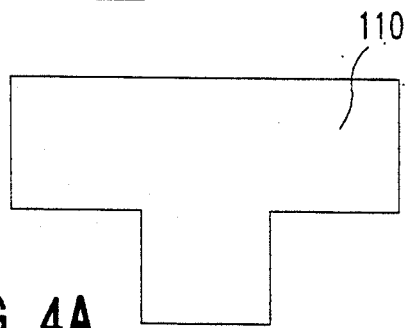
FIGS. 4A–4C shows a shape filled and sleeved according to the prior art.
Figure 4C:
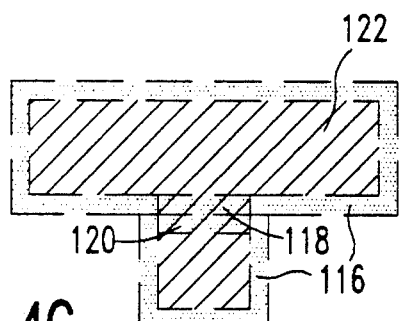
Figure 4B:
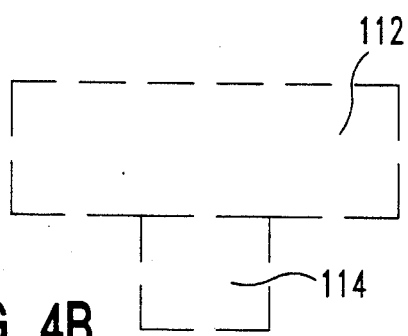
Figure 4D:
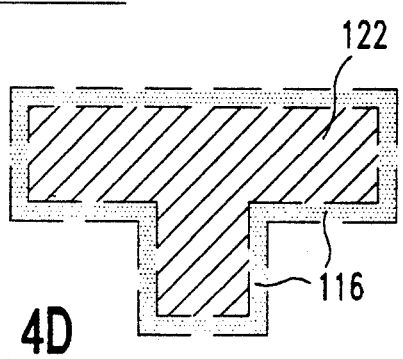

Column 5, line 31, "Figs. 4A-4C" should read --Figs. 4A-4D--.

Figure 13A:
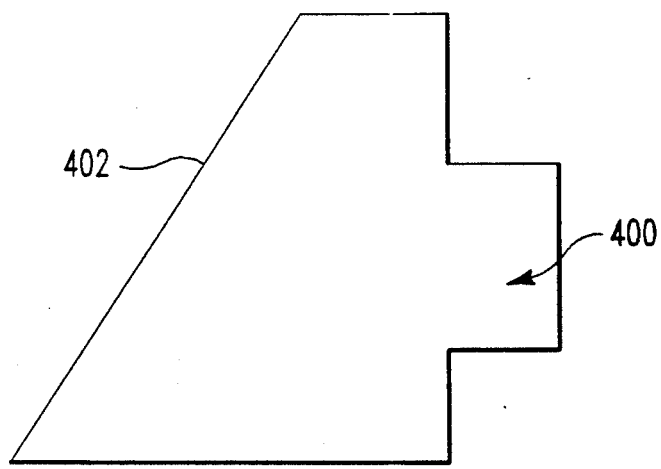
FIG. 13A–13B shows a shape with an angled edge as filled by a prior art fill method and by the preferred embodiment.
Figure 13B:
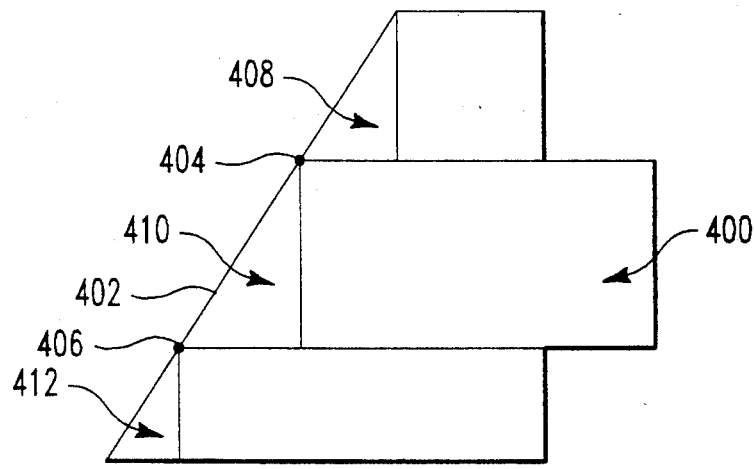
Figure 13C:
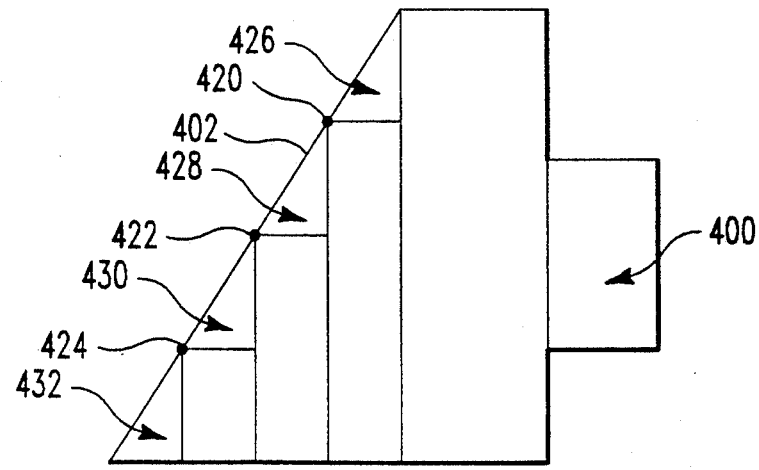

Column 5, line 56, "Fig. 13A-13B" should read --Figs. 13A-13C--.

Column 7, line 9, "Additionall" should read --Additionally--.

Column 9, line 3 Table, "CALL PRCCESS_YBOT" should read -- CALL PROCESS_YBOT--.

Column 14, line 11, "VAIUE" should read --VALUE--.

Column 20, claim 8, line 8, "the steps of: a connecting side" should read --the steps of:
    a. connecting side--.

Column 20, claim 10, line 40, "step" should be --steps--.

UNITED STATES PATENT AND TRADEMARK OFFICE
CERTIFICATE OF CORRECTION

PATENT NO.  : 5,159,201

DATED       : October 27, 1992

INVENTOR(S) : Joseph B. Frei

It is certified that error appears in the above-identified patent and that said Letters Patent is hereby corrected as shown below:

Column 21, claim 17, line 56, "forming a top chain", should read --forming a top chain of edges--.

Column 22, claim 22, line 40, "eges" should read --edges--.

Column 22, claim 22, line 60, and line 67, "optinal" should read --optional--.

Column 23, claim 22, line 5 "closign" should read --closing--.

Signed and Sealed this

Twenty-fifth Day of January, 1994

Attest:

BRUCE LEHMAN

Attesting Officer

Commissioner of Patents and Trademarks